United States Patent
Tajic et al.

(10) Patent No.: US 12,081,194 B2
(45) Date of Patent: *Sep. 3, 2024

(54) TOP ELECTRODES AND DIELECTRIC SPACER LAYERS FOR BULK ACOUSTIC WAVE RESONATORS

(71) Applicant: Qorvo US, Inc., Greensboro, NC (US)

(72) Inventors: Alireza Tajic, Winter Springs, FL (US); Paul Stokes, Orlando, FL (US); Robert Aigner, Ocoee, FL (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/192,312

(22) Filed: Mar. 29, 2023

(65) Prior Publication Data
US 2023/0231535 A1    Jul. 20, 2023

Related U.S. Application Data

(63) Continuation of application No. 17/821,906, filed on Aug. 24, 2022, now Pat. No. 11,722,119, which is a
(Continued)

(51) Int. Cl.
*H03H 9/13*    (2006.01)
*H03H 9/02*    (2006.01)
(Continued)

(52) U.S. Cl.
CPC ........ *H03H 9/132* (2013.01); *H03H 9/02062* (2013.01); *H03H 9/02086* (2013.01);
(Continued)

(58) Field of Classification Search
CPC ........... H03H 9/02086; H03H 9/02157; H03H 9/132; H03H 9/0211; H03H 9/02118;
(Continued)

(56) References Cited

U.S. PATENT DOCUMENTS 7,982,239 B2  7/2011  McNutt et al.
10,950,719 B2  3/2021  Pala et al.
(Continued)

FOREIGN PATENT DOCUMENTS

CN  111786645 A  10/2020
EP     4148997 A1   3/2023
(Continued)

OTHER PUBLICATIONS

Nguyen, et al., "A Design Approach for High-Q FBARs With a Dual-Step Frame", IEEE Transactions on Ultrasonics, Ferroelectrics, and Frequency Control, vol. 65, Issue 9, Sep. 2018, 9 pages.
(Continued)

*Primary Examiner* — Jeffrey M Shin
(74) *Attorney, Agent, or Firm* — Withrow & Terranova, P.L.L.C.

(57) ABSTRACT

Bulk acoustic wave (BAW) resonators and particularly top electrodes with step arrangements for BAW resonators are disclosed. Top electrodes on piezoelectric layers are disclosed that include a border (BO) region with a dual-step arrangement where an inner step and an outer step are formed with increasing heights toward peripheral edges of the top electrode. Dielectric spacer layers may be provided between the outer steps and the piezoelectric layer. Passivation layers are disclosed that extend over the top electrode either to peripheral edges of the piezoelectric layer or that are inset from peripheral edges of the piezoelectric layer. Piezoelectric layers may be arranged with reduced thickness portions in areas that are uncovered by top electrodes. BAW resonators as disclosed herein are provided with high quality factors and suppression of spurious modes while also providing weakened BO modes that are shifted farther away from passbands of such BAW resonators.

20 Claims, 17 Drawing Sheets

Related U.S. Application Data continuation of application No. 16/525,858, filed on Jul. 30, 2019, now Pat. No. 11,502,667.

(60) Provisional application No. 62/792,113, filed on Jan. 14, 2019.

(51) Int. Cl.
| | |
|---|---|
| *H03H 9/17* | (2006.01) |
| *H03H 9/54* | (2006.01) |
| *H10N 30/87* | (2023.01) |
| *H10N 30/88* | (2023.01) |

(52) U.S. Cl.
CPC ............ *H03H 9/173* (2013.01); *H03H 9/175* (2013.01); *H03H 9/54* (2013.01); *H10N 30/87* (2023.02); *H10N 30/883* (2023.02)

(58) Field of Classification Search
CPC ............. H03H 9/173; H03H 2003/027; H03H 2003/028; H03H 3/02
See application file for complete search history.

(56) References Cited

U.S. PATENT DOCUMENTS

| | | | |
|---|---|---|---|
| 11,349,454 B2 | 5/2022 | Shin et al. | |
| 11,502,667 B2 | 11/2022 | Tajic et al. | |
| 11,722,119 B2 * | 8/2023 | Tajic | H03H 9/173 |
| | | | 310/365 |
| 2012/0161902 A1 | 6/2012 | Feng et al. | |
| 2014/0176261 A1 | 6/2014 | Burak et al. | |
| 2014/0354115 A1 | 12/2014 | Burak et al. | |
| 2015/0280687 A1 | 10/2015 | Burak et al. | |
| 2016/0118958 A1 | 4/2016 | Burak et al. | |
| 2017/0047907 A1 | 2/2017 | Burak et al. | |
| 2017/0263844 A1 | 9/2017 | Tajic et al. | |
| 2017/0310303 A1 | 10/2017 | Thalhammer et al. | |
| 2018/0277735 A1 | 9/2018 | Jeong et al. | |
| 2020/0099359 A1 | 3/2020 | Shin et al. | |
| 2020/0212884 A1 | 7/2020 | Shin et al. | |
| 2021/0143792 A1 | 5/2021 | Pollard | |
| 2021/0328573 A1 | 10/2021 | Lochner | |
| 2021/0344321 A1 | 11/2021 | Shin et al. | |
| 2022/0052664 A1 | 2/2022 | Schiek et al. | |
| 2022/0416761 A1 | 12/2022 | Tajic et al. | |

FOREIGN PATENT DOCUMENTS

| | | | |
|---|---|---|---|
| JP | 2008042878 A | 2/2008 |
| JP | 2009100367 A | 5/2009 |
| JP | 2013138425 A | 7/2013 |
| JP | 2015099988 A | 5/2015 |

OTHER PUBLICATIONS

Thalhammer, et al., "Finite Element Analysis of BAW Devices: Principles and Perspectives", International Ultrasonics Symposium, Taipei, Taiwan, Oct. 2015, 10 pages.

Non-Final Office Action for U.S. Appl. No. 16/525,858, dated Mar. 18, 2020, 10 pages.

Notice of Allowance for U.S. Appl. No. 16/525,858, dated Jul. 12, 2022, 7 pages.

Non-Final Office Action for U.S. Appl. No. 17/821,906, dated Jan. 3, 2023, 6 pages.

Sheng, K. et al., "Vertical SiC JFET with a Monolithically Integrated JBS Diode," 2009 21st International Symposium on Power Semiconductor Devices & IC's, Jun. 14-18, 2009, Barcelona, Spain, IEEE, pp. 255-258.

Notice of Reasons for Rejection for Japanese Patent Application No. 2020002070, mailed Dec. 22, 2023, 11 pages.

Garcia-Pastor, D. et al., "Nonlinear Effects of Electrode and Bragg Reflector Materials in BAW Resonators," IEEE International Ultrasonics Symposium, Sep. 2017, 4 pages.

Li, X. et al., "Use of double-raised-border structure for quality factor enhancement of type II piston mode FBAR," Microsystem Technologies, vol. 24, No. 7, May 2018, pp. 2991-2997.

Extended European Search Report for European Patent Application No. 23193004.1, mailed Feb. 6, 2024, 11 pages.

Extended European Search Report for European Patent Application No. 23193005.8, mailed Feb. 12, 2024, 10 pages.

Notice of Reasons for Rejection for Japanese Patent Application No. 2020002070, mailed May 15, 2024, 9 pages.

Notice of Preliminary Rejection for Korean Patent Application No. 1020200003114, mailed Jun. 27, 2024, 10 pages.

* cited by examiner

TOP ELECTRODES AND DIELECTRIC SPACER LAYERS FOR BULK ACOUSTIC WAVE RESONATORS

RELATED APPLICATIONS

This application is a continuation of U.S. patent application Ser. No. 17/821,906, filed Aug. 24, 2022, issued as U.S. Pat. No. 11,722,119, which is a continuation of U.S. patent application Ser. No. 16/525,858, filed Jul. 30, 2019, issued as U.S. Pat. No. 11,502,667, which claims the benefit of provisional patent application Ser. No. 62/792,113, filed Jan. 14, 2019, the disclosures of which are hereby incorporated herein by reference in their entireties.

FIELD OF THE DISCLOSURE

The present disclosure relates to bulk acoustic wave (BAW) resonators, and particularly to top electrodes with step arrangements for BAW resonators.

BACKGROUND

Acoustic resonators and, particularly, bulk acoustic wave (BAW) resonators are used in many high-frequency, communication applications. In particular, BAW resonators are often employed in filter networks that operate at frequencies above 1.5 gigahertz (GHz) and require a flat passband, have exceptionally steep filter skirts and squared shoulders at the upper and lower ends of the passband, and provide excellent rejection outside of the passband. BAW-based filters also have relatively low insertion loss, tend to decrease in size as the frequency of operation increases, and are relatively stable over wide temperature ranges. As such, BAW-based filters are the filter of choice for many 3rd Generation (3G) and 4th Generation (4G) wireless devices, and are destined to dominate filter applications for 5th Generation (5G) wireless devices. Most of these wireless devices support cellular, wireless fidelity (Wi-Fi), Bluetooth, and/or near field communications on the same wireless device, and as such, pose extremely challenging filtering demands. While these demands keep raising the complexity of the wireless devices, there is a constant need to improve the performance of BAW resonators and BAW-based filters as well as decrease the cost and size associated therewith.

SUMMARY

The present disclosure relates to bulk acoustic wave (BAW) resonators, and particularly to top electrodes with step arrangements for BAW resonators. BAW resonators as disclosed herein include a piezoelectric layer that is arranged between top and bottom electrodes. Top electrodes are disclosed that include a border (BO) region with a dual-step arrangement where an inner step and an outer step are formed with increasing heights toward peripheral edges of the top electrode. Dielectric spacer layers may be provided between the outer steps and the piezoelectric layer. Passivation layers are disclosed that extend over the top electrode either to peripheral edges of the piezoelectric layer or that are inset from the peripheral edges of the piezoelectric layer. Piezoelectric layers may be arranged with reduced thickness portions in areas that are uncovered by top electrodes. BAW resonators as disclosed herein are provided with high quality factors and suppression of spurious modes while also providing weakened BO modes that are shifted farther away from passbands of such BAW resonators.

In one aspect, a BAW resonator comprises: a bottom electrode; a piezoelectric layer over the bottom electrode; a top electrode over the piezoelectric layer, the top electrode forming a central region that forms a first height from the piezoelectric layer and a BO region that extends about a periphery of the central region, the BO region comprising: an inner step on the piezoelectric layer, the inner step forming a second height from the piezoelectric layer that is greater than the first height of the central region; and an outer step on the piezoelectric layer, the outer step forming a third height from the piezoelectric layer that is greater than the first height of the central region; and a dielectric spacer layer arranged between the outer step and the piezoelectric layer. In certain embodiments, the third height is greater than the second height. In certain embodiments, the inner step and the outer step form mass loading portions of the top electrode. The dielectric spacer layer may comprise at least one of silicon dioxide, silicon nitride, or aluminum nitride. In certain embodiments, the bottom electrode is arranged to extend along a bottom of the piezoelectric layer a distance that is in a range from 200 nm to 1 µm past a lateral edge of the top electrode that is on a top of the piezoelectric layer. The BAW resonator may further comprise a passivation layer over the top electrode. In certain embodiments, the passivation layer extends to a peripheral edge of the piezoelectric layer. In certain embodiments, the passivation layer extends to a peripheral edge of the outer step and the passivation layer is inset from a peripheral edge of the piezoelectric layer. In certain embodiments, the top electrode forms an inner ring that forms a fourth height from the piezoelectric layer and the fourth height is less than the first height of the central region. In certain embodiments, the inner ring is spaced apart from the BO ring by a gap portion of the top electrode. In certain embodiments, the outer step comprises a first outer step and the BAW resonator further comprises a second outer step such that the second outer step, the first outer step, and the inner step are arranged to form a step structure of descending heights from the BO region toward the central region. The BAW resonator may comprise a solidly mounted resonator (SMR) type BAW resonator or a film bulk acoustic resonator (FBAR).

In another aspect, a BAW resonator comprises: a bottom electrode; a piezoelectric layer over the bottom electrode; and a top electrode over the piezoelectric layer, the top electrode forming a central region and a BO region that extends about a periphery of the central region, the BO region comprising an inner step and an outer step, wherein the inner step is arranged between the central region and the outer step; wherein an outside region is defined by peripheral boundaries of the top electrode, and at least a portion of the piezoelectric layer in the outside region forms a reduced thickness compared with a portion of the piezoelectric layer that is registered with the top electrode. In certain embodiments, the central region forms a first height from the piezoelectric layer, the inner step forms a second height from the piezoelectric layer, and the outer step forms a third height from the piezoelectric layer, and wherein the second height and the third height are greater than the first height. The BAW resonator may further comprise a dielectric spacer layer arranged between the outer step and the piezoelectric layer. In certain embodiments, the bottom electrode overlaps with the portion of the piezoelectric layer that forms the reduced thickness. The BAW resonator may further comprise a passivation layer over the top electrode. In certain embodiments, the passivation layer extends to a peripheral edge of the piezoelectric layer. In certain embodiments, the top electrode forms an inner ring that comprises a mass-reducing region of the top electrode. In certain embodiments, the inner ring is spaced apart from the BO region by a gap portion of the top electrode. In certain embodiments, the inner ring is directly adjacent the BO region of the top electrode. The BAW resonator may comprise a SMR type BAW resonator or a FBAR.

In another aspect, any of the foregoing aspects, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
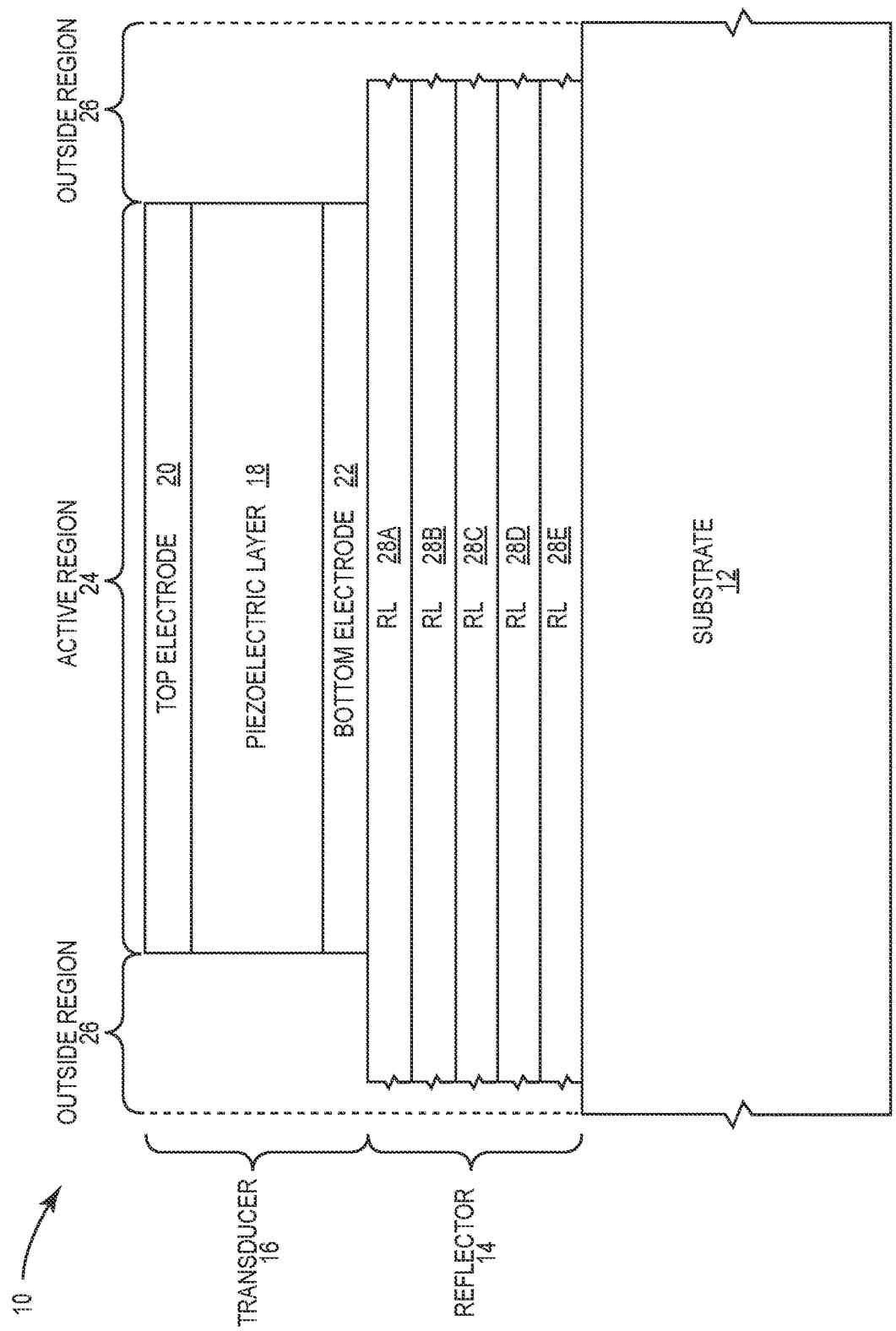
FIG. 1 is a diagram illustrating a conventional bulk acoustic wave (BAW) resonator.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to bulk acoustic wave (BAW) resonators, and particularly to top electrodes with step arrangements for BAW resonators. BAW resonators as disclosed herein include a piezoelectric layer that is arranged between top and bottom electrodes. Top electrodes are disclosed that include a border (BO) region with a dual-step arrangement where an inner step and an outer step are formed with increasing heights toward peripheral edges of the top electrode. Dielectric spacer layers may be provided between the outer steps and the piezoelectric layer. Passivation layers are disclosed that extend over the top electrode either to peripheral edges of the piezoelectric layer or that are inset from the peripheral edges of the piezoelectric layer. Piezoelectric layers may be arranged with reduced thickness portions in areas that are uncovered by top electrodes. BAW resonators as disclosed herein are provided with high quality factors and suppression of spurious modes while also providing weakened BO modes that are shifted farther away from passbands of such BAW resonators.

Prior to delving into the details of these concepts, an overview of BAW resonators and filters that employ BAW resonators is provided. BAW resonators are used in many high-frequency filter applications. An exemplary BAW resonator 10 is illustrated in FIG. 1. The BAW resonator 10 is a solidly mounted resonator (SMR) type BAW resonator 10 and generally includes a substrate 12, a reflector 14 mounted over the substrate 12, and a transducer 16 mounted over the reflector 14. The transducer 16 rests on the reflector 14 and includes a piezoelectric layer 18, which is sandwiched between a top electrode 20 and a bottom electrode 22. The top and bottom electrodes 20, 22 may be formed of tungsten (W), molybdenum (Mo), platinum (Pt), or like material, and the piezoelectric layer 18 may be formed of aluminum nitride (AlN), zinc oxide (ZnO) or other appropriate piezoelectric material. Although shown in FIG. 1 as including a single layer, the piezoelectric layer 18, the top electrode 20, and/or the bottom electrode 22 may include multiple layers of the same material, multiple layers in which at least two layers are different materials, or multiple layers in which each layer is a different material.

The BAW resonator 10 is divided into an active region 24 and an outside region 26. The active region 24 generally corresponds to the section of the BAW resonator 10 where the top and bottom electrodes 20, 22 overlap and also includes the layers below the overlapping top and bottom electrodes 20, 22. The outside region 26 corresponds to the section of the BAW resonator 10 that surrounds the active region 24.

For the BAW resonator 10, applying electrical signals across the top electrode 20 and the bottom electrode 22 excites acoustic waves in the piezoelectric layer 18. These acoustic waves primarily propagate vertically. A primary goal in BAW resonator design is to confine these vertically-propagating acoustic waves in the transducer 16. Acoustic waves traveling upwardly are reflected back into the transducer 16 by an air-metal boundary at a top surface of the top electrode 20. Acoustic waves traveling downwardly are reflected back into the transducer 16 by the reflector 14, or by an air cavity, which is provided just below the transducer 16 in a film bulk acoustic resonator (FBAR).

The reflector 14 is typically formed by a stack of reflector layers (RL) 28A through 28E (referred to generally as reflector layers 28), which alternate in material composition to produce a significant reflection coefficient at the junction of adjacent reflector layers 28. Typically, the reflector layers 28 alternate between materials having high and low acoustic impedances, such as tungsten (W) and silicon dioxide ($SiO_2$). While only five reflector layers 28 are illustrated in FIG. 1, the number of reflector layers 28 and the structure of the reflector 14 will vary from one design to another.

Figure 2:
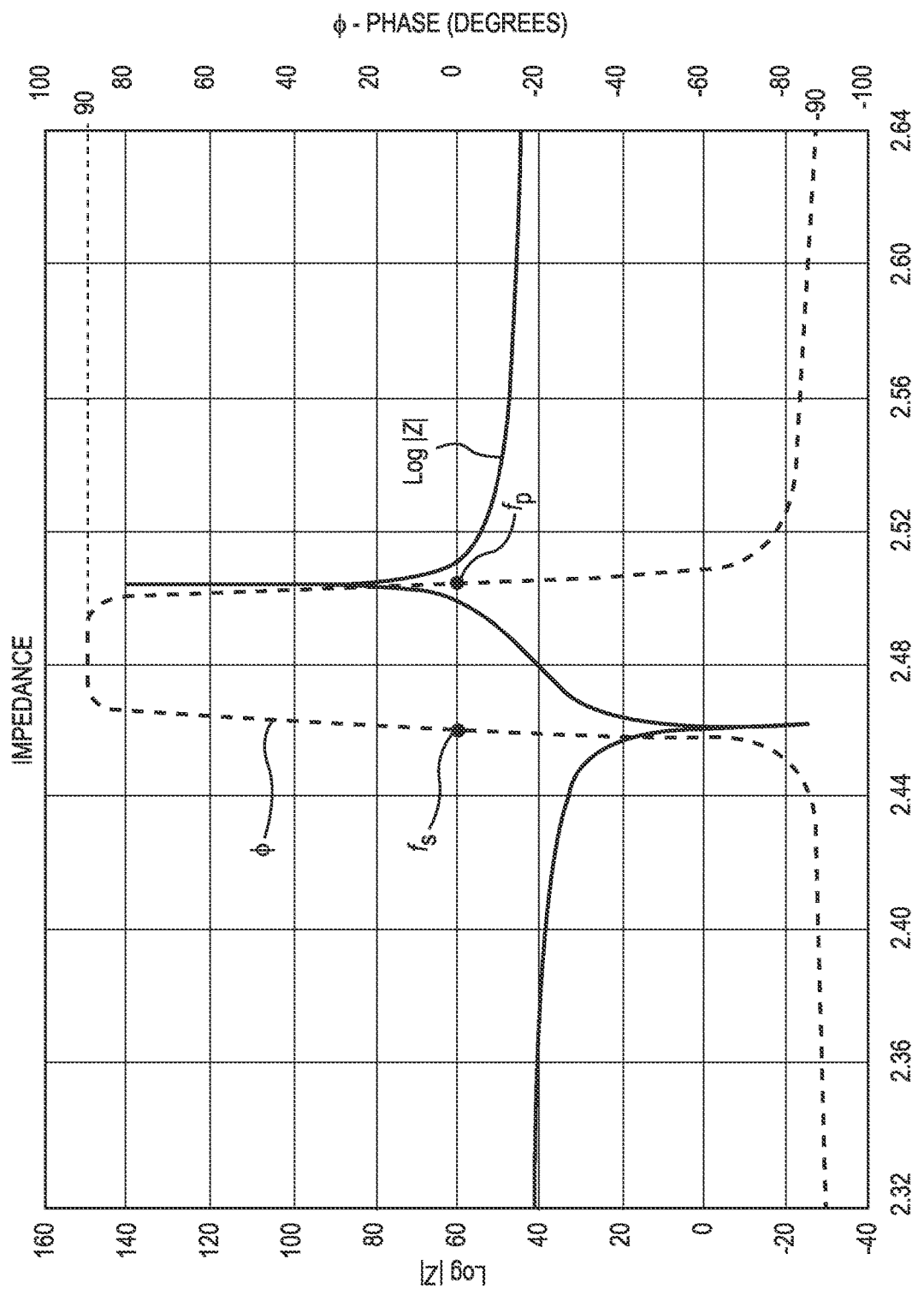
FIG. 2 is a diagram graphically illustrating the magnitude and phase of the electrical impedance as a function of the frequency for a relatively ideal BAW resonator.

The magnitude (Z) and phase ($\phi$) of the electrical impedance as a function of the frequency (GHz) for a relatively ideal BAW resonator 10 is provided in FIG. 2. The magnitude (Z) of the electrical impedance is illustrated by the solid line, while the phase ($\phi$) of the electrical impedance is illustrated by the dashed line. A unique feature of the BAW resonator 10 is that it has both a resonance frequency and an antiresonance frequency. The resonance frequency is typically referred to as the series resonance frequency ($f_s$), and the antiresonance frequency is typically referred to as the parallel resonance frequency ($f_p$). The series resonance frequency ($f_s$) occurs when the magnitude of the impedance, or reactance, of the BAW resonator 10 approaches zero. The parallel resonance frequency ($f_p$) occurs when the magnitude of the impedance, or reactance, of the BAW resonator 10 peaks at a significantly high level. In general, the series resonance frequency ($f_s$) is a function of the thickness or height of the piezoelectric layer 18 and the mass of the bottom and top electrodes 20, 22.

For the phase, the BAW resonator 10 acts like an inductance that provides a 90° phase shift between the series resonance frequency ($f_s$) and the parallel resonance frequency ($f_p$). In contrast, the BAW resonator 10 acts like a capacitance that provides a −90° phase shift below the series resonance frequency ($f_s$) and above the parallel resonance frequency ($f_p$). The BAW resonator 10 presents a very low, near zero, resistance at the series resonance frequency ($f_s$), and a very high resistance at the parallel resonance frequency ($f_p$). The electrical nature of the BAW resonator 10 lends itself to the realization of a very high quality factor (Q) inductance over a relatively short range of frequencies, which has proven to be very beneficial in high frequency filter networks, especially those operating at frequencies around 1.8 GHz and above.

Figure 3:
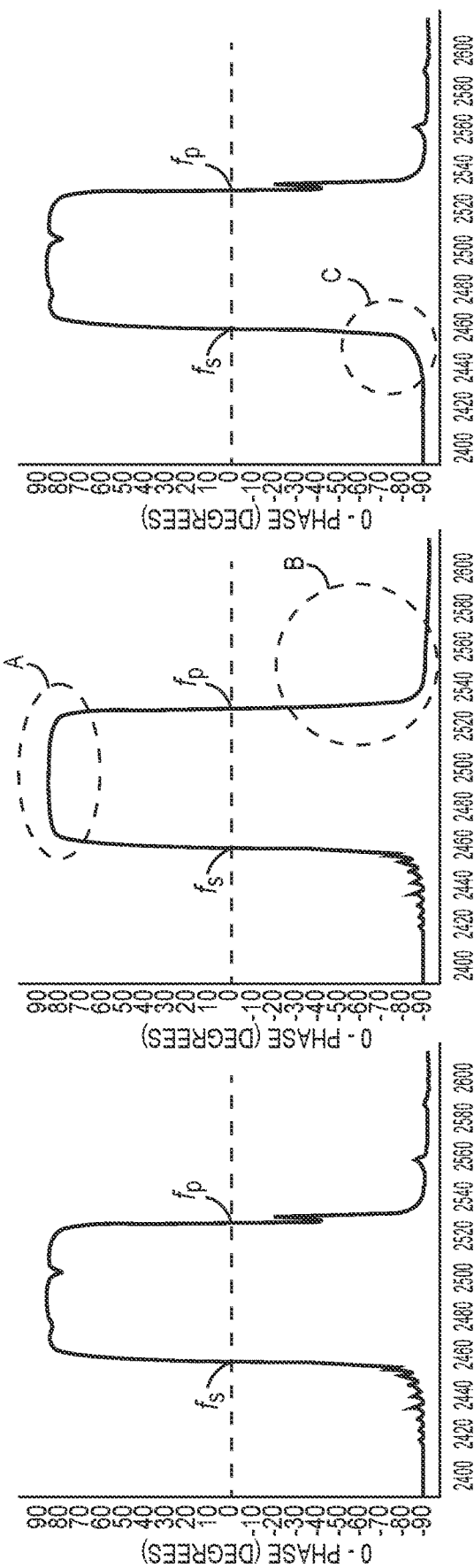
FIGS. 3A-3C are diagrams graphically illustrating phase curves for various conventional BAW resonators.

Unfortunately, the phase (ϕ) curve of FIG. 2 is representative of an ideal phase curve. In reality, approaching this ideal is challenging. A typical phase curve for the BAW resonator 10 of FIG. 1 is illustrated in FIG. 3A. Instead of being a smooth curve, the phase curve of FIG. 3A includes a ripple below the series resonance frequency ($f_s$), between the series resonance frequency ($f_s$) and the parallel resonance frequency ($f_p$), and above the parallel resonance frequency ($f_p$). The ripple is the result of spurious modes, which are caused by spurious resonances that occur in corresponding frequencies. While the vast majority of the acoustic waves in the BAW resonator 10 propagate vertically, various boundary conditions about the transducer 16 result in the propagation of lateral (horizontal) acoustic waves, which are referred to as lateral standing waves. The presence of these lateral standing waves reduces the potential quality factor (Q) associated with the BAW resonator 10.

Figure 4:
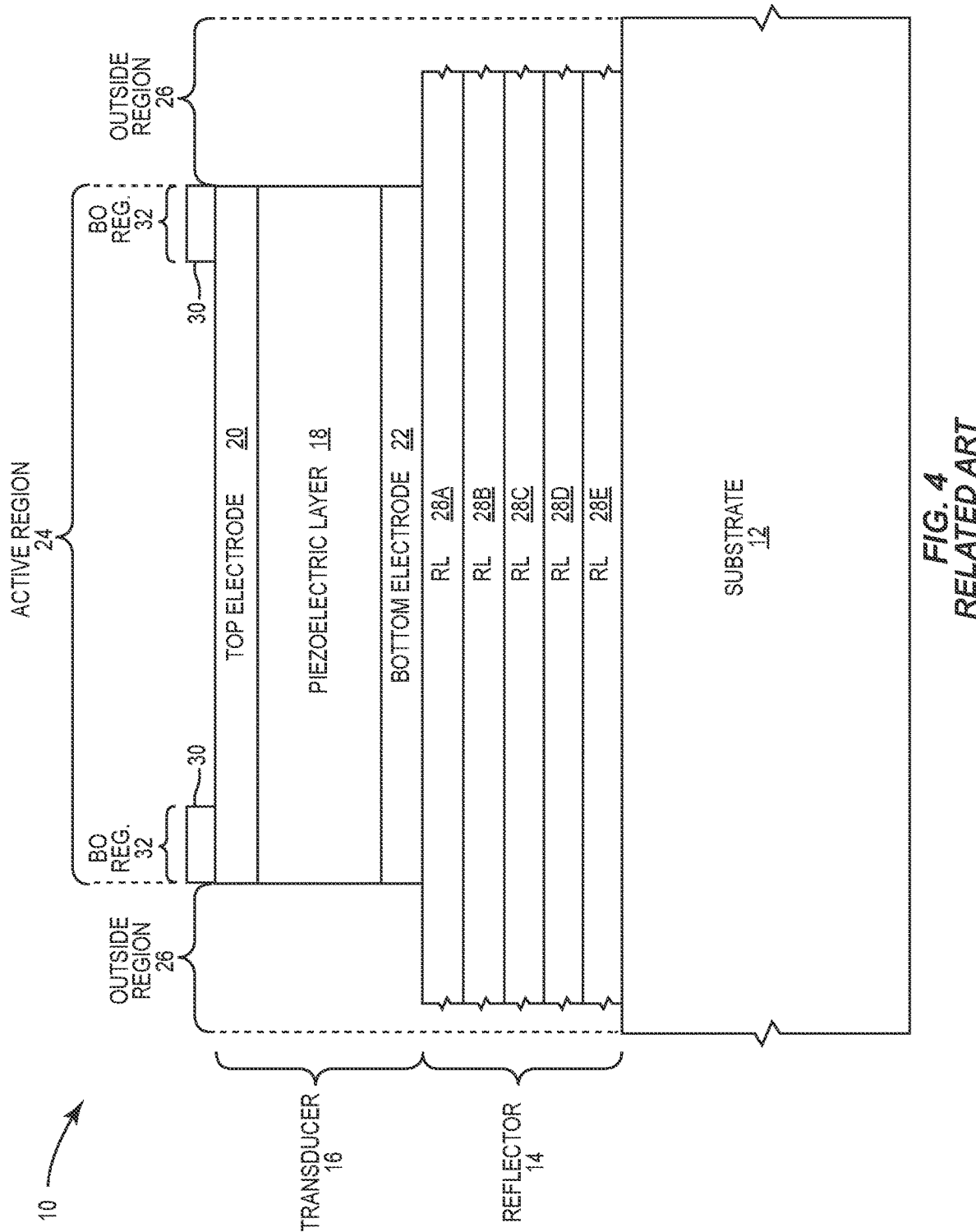
FIG. 4 is a diagram illustrating a conventional BAW resonator with a top electrode including a border (BO) ring.

As illustrated in FIG. 4, a BO ring 30 is formed on or within the top electrode 20 to suppress certain of the spurious modes. The spurious modes that are suppressed by the BO ring 30 are those above the series resonance frequency ($f_s$), as highlighted by circles A and B in the phase curve of FIG. 3B. Circle A shows a suppression of the ripple, and thus the spurious mode, in the passband of the phase curve, which resides between the series resonance frequency ($f_s$) and the parallel resonance frequency ($f_p$). Circle B shows suppression of the ripple, and thus the spurious modes, above the parallel resonance frequency ($f_p$). Notably, the spurious mode in the upper shoulder of the passband, which is just below the parallel resonance frequency ($f_p$), and the spurious modes above the passband are suppressed, as evidenced by the smooth or substantially ripple free phase curve between the series resonance frequency ($f_s$) and the parallel resonance frequency ($f_p$) and above the parallel resonance frequency ($f_p$).

The BO ring 30 corresponds to a mass loading of a portion of the top electrode 20 that extends about a periphery of the active region 24. In this regard, the BO ring 30 with mass loading forms a raised frame that is arranged about a periphery of the top electrode 20. The BO ring 30 may correspond to a thickened portion of the top electrode 20 or the application of additional layers of an appropriate material over the top electrode 20. The portion of the BAW resonator 10 that includes and resides below the BO ring 30 is referred to as a BO region 32. Accordingly, the BO region 32 corresponds to an outer, perimeter portion of the active region 24 and resides inside of the active region 24.

While the BO ring 30 is effective at suppressing spurious modes above the series resonance frequency ($f_s$), the BO ring 30 has little or no impact on those spurious modes below the series resonance frequency ($f_s$), as shown in FIG. 3B. A technique referred to as apodization is often used to suppress the spurious modes that fall below the series resonance frequency ($f_s$).

Apodization works to avoid, or at least significantly reduce, any lateral symmetry in the BAW resonator 10, or at least in the transducer 16 thereof. The lateral symmetry corresponds to the footprint of the transducer 16, and avoiding the lateral symmetry corresponds to avoiding symmetry associated with the sides of the footprint. For example, one may choose a footprint that corresponds to a pentagon instead of a square or rectangle. Avoiding symmetry helps reduce the presence of lateral standing waves in the transducer 16. Circle C of FIG. 3C illustrates the effect of apodization in which the spurious modes below the series resonance frequency ($f_s$) are suppressed. Assuming no BO ring 30 is provided, one can readily see in FIG. 3C that apodization fails to suppress those spurious modes above the series resonance frequency ($f_s$). As such, the typical BAW resonator 10 employs both apodization and the BO ring 30.

A thickness or height of the BO ring 30 may be measured in a direction perpendicular to or away from the piezoelectric layer 18 and a width of the BO ring 30 may be measured in a direction parallel to or laterally across the piezoelectric layer 18. The thickness and the width of the BO ring 30 may be concurrently tuned to provide suppression of spurious modes and to provide improvements to the quality factor at antiresonance frequency ($Q_p$). The added mass associated with the BO ring 30 typically causes the BO region 32 to resonate at a slightly lower frequency than other portions of the active region 24. As a result, the presence of BO rings can introduce undesirable modes, or BO modes, at frequencies below the series resonance frequency ($f_s$).

Figure 5:
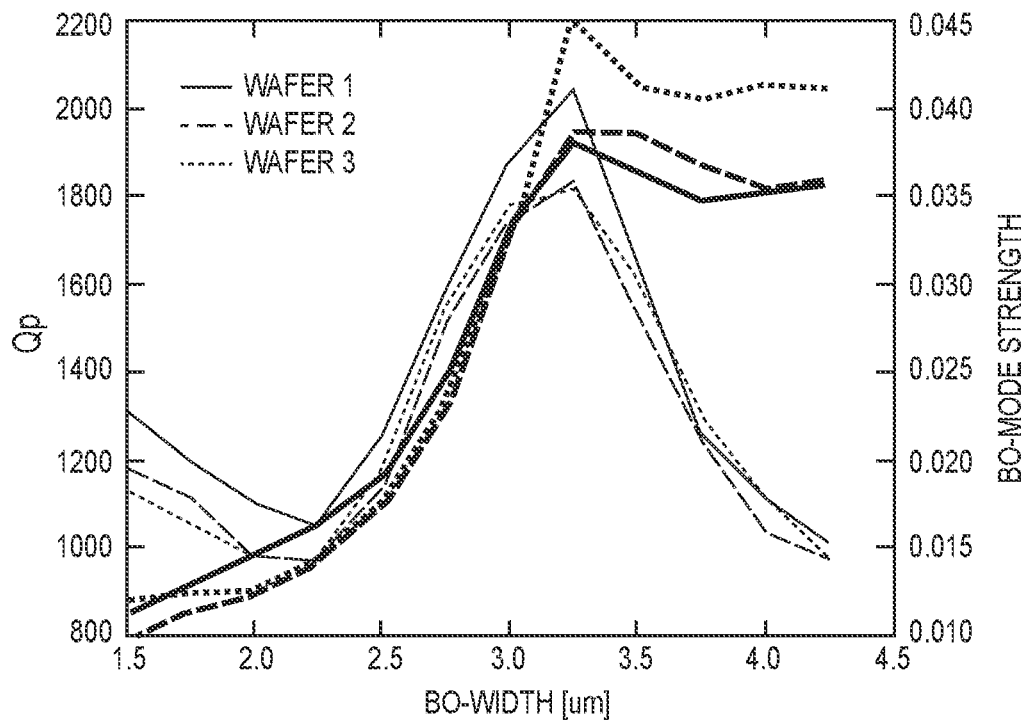
FIG. 5 is a diagram graphically illustrating the relationship of BO ring width to quality factor at antiresonance frequency ($Q_p$) and the relative strength of BO modes formed.

FIG. 5 is a diagram graphically illustrating the relationship of BO ring width to quality factor at antiresonance frequency ($Q_p$) and the relative strength of BO modes formed. In FIG. 5, the x-axis represents the BO ring width in microns (μm) while the while the primary y-axis represents the $Q_p$ and the secondary y-axis represents relative strength or magnitude of the BO modes formed. The diagram of FIG. 5 plots data for three wafers that each included BAW resonators with varying BO ring widths. As shown, the $Q_p$ values generally increase with increasing BO ring widths and a highest $Q_p$ value corresponds to a BO ring width of just over 3 μm. As also shown, the BO mode strength also generally increases with increasing BO ring widths. For even higher BO ring widths, the $Q_p$ values decrease while the BO mode strength values remain high. In this manner, a BO ring that is tuned to provide a high $Q_p$ may also introduce undesirable BO modes to the corresponding BAW device.

Figure 6:
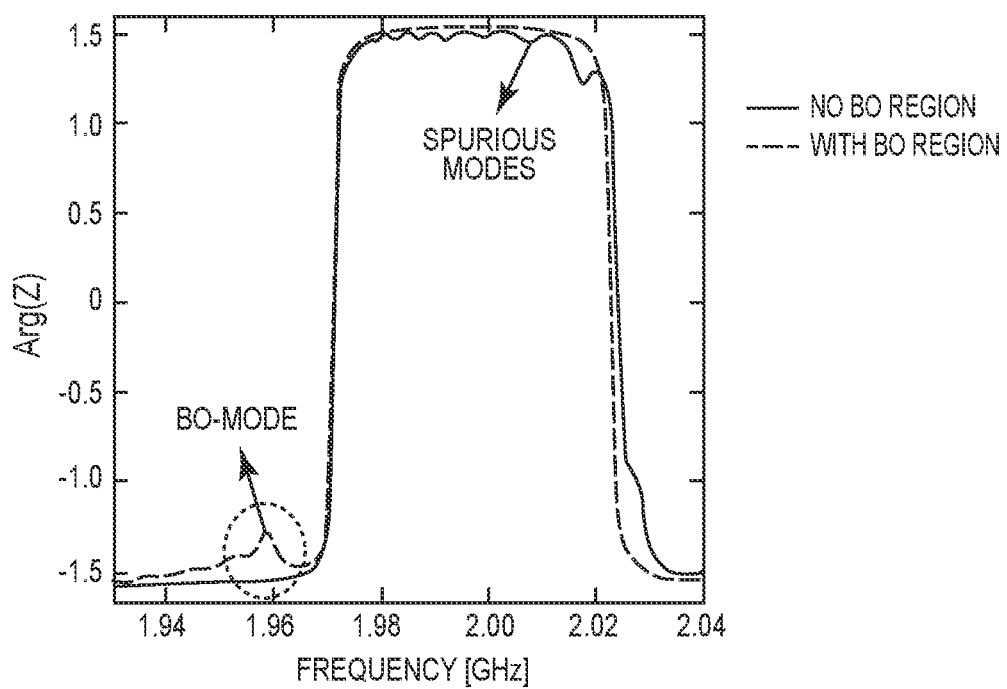
FIG. 6 is a diagram graphically illustrating phase curves for BAW resonators with and without BO rings.

FIG. 6 is a diagram graphically illustrating the phase curves for BAW resonators with and without BO rings. As illustrated, spurious modes that are present within the passband of a BAW resonator without a BO ring are suppressed with the addition of a BO ring; however, the presence of the BO ring introduces undesirable BO modes below the passband. BO modes may be introduced outside or even inside the passband of the resonator and may restrict the design or use BAW resonators for wide bandwidth filtering applications. If the BO modes are within the passband, insertion loss can be impacted. BO modes that are present outside of the passband can be problematic for BAW multiplexing applications where BAW filters of different frequency bands operate at the same time. In such multiplexing applications, BO modes of one BAW filter can fall into the passband of other BAW filters and introduce interference during multiplexing.

Figure 7:
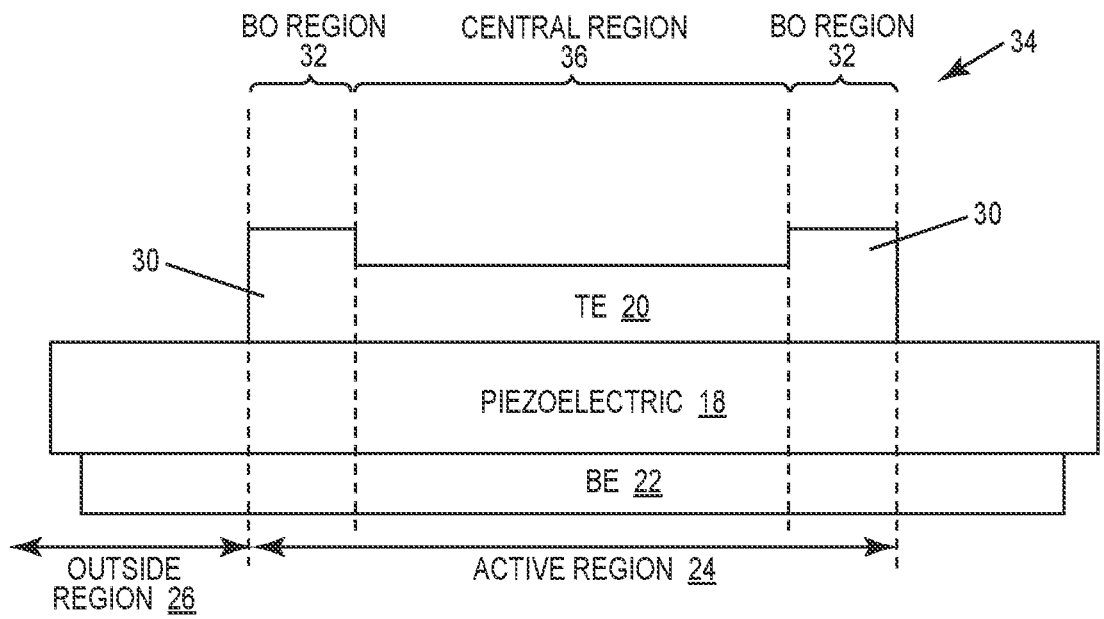
FIG. 7 is a cross-sectional diagram illustrating a BAW resonator where a BO region is arranged in a similar configuration to the BAW resonator of FIG. 4.

FIG. 7 is a cross-sectional diagram illustrating a BAW resonator 34 where the BO region 32 is arranged in a similar configuration to the BAW resonator 10 of FIG. 4. For illustrative purposes, FIG. 7 is a simplified view of the BAW resonator 34 and is not necessarily drawn to scale; however, it is understood the BAW resonator 34 may include many of the same components as the BAW resonator 10 of FIG. 4. As illustrated in FIG. 7, the BO region 32 is arranged about a periphery of the top electrode 20 and a central region 36 of the top electrode 20 is defined laterally inside of the BO region 32. The BO ring 30 is formed on or within the top electrode 20 to suppress certain of the spurious modes as described above for FIG. 4. In FIG. 7, the active region 24 is indicated as the section where the top electrode 20 and the bottom electrode 22 overlap on opposing sides of the piezoelectric layer 18. In this manner, the active region 24 generally corresponds to a portion of the piezoelectric layer 18 that is electrically driven such that an electric field is provided between overlapping portions of the top electrode 20 and the bottom electrode 22. The outside region 26 generally corresponds to the portion of the piezoelectric layer 18 that is outside of the active region 24 and in this regard, the outside region 26 is generally not electrically driven. In the configuration of FIG. 7, the BO region 32 and corresponding BO ring 30 are arranged within the active region 24.

Figure 8:
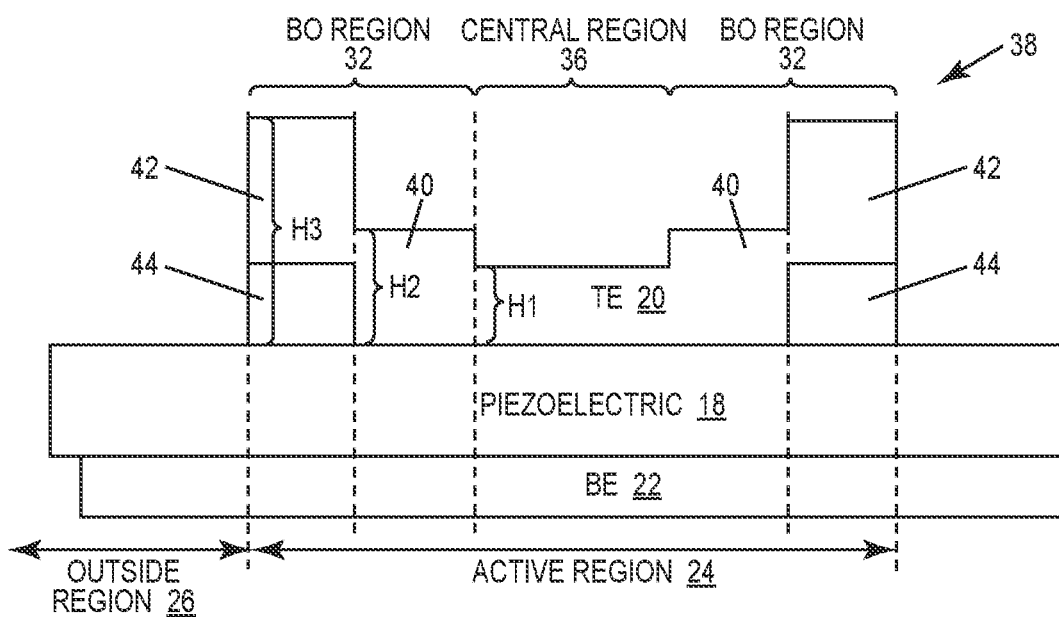
FIG. 8 is a cross-sectional diagram illustrating a BAW resonator where a BO region forms a dual-step configuration about a periphery of a top electrode according to embodiments disclosed herein.

FIG. 8 is a cross-sectional diagram illustrating a BAW resonator 38 where the BO region 32 forms a dual-step configuration about a periphery of the top electrode 20 according to embodiments disclosed herein. For illustrative purposes, FIG. 8 is a simplified view of the BAW resonator 38 and is not necessarily drawn to scale; however, it is understood the BAW resonator 38 may include many of the same components as the BAW resonator 10 of FIG. 4. The BO region 32 includes an inner step 40 and an outer step 42 that collectively form a stepped profile of raised heights that decrease from a periphery of the BO region 32 toward the central region 36 of the top electrode 20. In certain embodiments, the inner step 40 forms a first BO ring that is a first mass loading portion of the top electrode 20 and the outer step 42 forms a second BO ring that is a second mass loading portion of the top electrode 20. As indicated in FIG. 8, the central region 36 forms a first height H1 of the top electrode 20 as measured from the piezoelectric layer 18, the inner step 40 forms a second height H2 as measured from the piezoelectric layer 18, and the outer step 42 forms a third height H3 as measured from the piezoelectric layer 18. In certain embodiments, the second height H2 and the third height H3 are both greater than the first height H1. In certain embodiments, the third height H3 is greater than the second height H2, and the second height H2 is greater than the first height H1, thereby forming a dual-step configuration for the BO region 32 that decreases in height toward the central region 36. Relative dimensions of the first height H1, second height H2, and third height H3, as well as relative widths of the inner step 40 and the outer step 42 are dependent on the desired operating frequency for the BAW resonator 38. BAW resonators as disclosed herein may be suited for operation in various frequency ranges including 1.5 GHz to 5.5 GHz. In certain embodiments, the second height H2 is greater than the first height H1 in a range from 40 nanometers (nm) to 80 nm. In certain embodiments, the third height H3 is greater than the first height H1 in a range from 50 nm to 200 nm. In this regard, the dual-step configuration of the BO region 32 forms a dual-frame structure that is arranged about the periphery of the top electrode 20. While the dual-step configuration is illustrated in FIG. 8, BAW resonators as disclosed herein may have configurations with additional steps, such as a three-step or four-step configuration. In such configurations, each additional step away from the central region 36 may be configured with increasing height.

By having a dual-step configuration where the inner step 40 and the outer step 42 are arranged with different heights, the BO region 32 is thereby configured to provide two different acoustic impedances. This provides acoustic impedance mismatch for laterally propagating Lamb waves within the BAW resonator 38 that would otherwise contribute to loss of energy or energy leakage and the reduction of Q factor for the BAW resonator 38. In order to achieve a desirably large acoustic mismatch and a corresponding large reflection coefficient, a material of large mass density is usually selected for the inner step 40 and the outer step 42. The height and width of each of the inner step 40 and the outer step 42 may be concurrently tuned to achieve a high suppression of spurious modes and a high quality factor at antiresonance frequency ($Q_p$). The increase in heights for the inner step 40 and the outer step 42 may accordingly result in a decrease in the velocity of laterally propagating Lamb waves and an increase in average mass density. In this manner, the dual-step configuration significantly reduces lateral energy leakage as well as mode conversions at the BO region 32, thereby providing a high Q-value for the BAW resonator 38. This provides suppression of spurious modes above the series resonance frequency ($f_s$) while also providing weakened BO modes that are shifted farther away from the passband of the BAW resonator 38.

As further illustrated in FIG. 8, the BAW resonator 38 may comprise a spacer layer 44 in certain embodiments. The spacer layer 44 may be arranged between the outer step 42 and the piezoelectric layer 18. In this manner, the spacer layer 44 may be registered with the outer step 42. In certain embodiments, peripheral edges of the spacer layer 44 are aligned with peripheral edges of the outer step 42. In certain embodiments, the spacer layer 44 comprises a dielectric material including at least one of silicon dioxide ($SiO_2$), silicon nitride (SiN, $Si_xN_y$, $Si_3N_4$), aluminum nitride (AlN), or combinations thereof. Despite the presence of the spacer layer 44 between the outer step 42 and the piezoelectric layer 18, electric fields are still generated in portions of the piezoelectric layer 18 that are registered with the outer step 42 and the spacer layer 44. In certain embodiments, the dielectric nature of the spacer layer 44 serves to reduce some electric fields in the piezoelectric layer 18 and will reduce coupling in that domain, thereby providing reduced magnitude of BO modes formed. The active region 24 of the BAW resonator 38 is formed where the top electrode 20 and the bottom electrode 22 overlap and includes the outer step 42. When compared with the BAW resonator 34 of FIG. 7, the active region 24 and the outside region 26 of the BAW resonator 38 may be configured with similar dimensions. Notably, the bottom electrode 22 may be arranged to extend laterally along the piezoelectric layer 18 such that the bottom electrode 22 extends farther than peripheral boundaries of the top electrode 20. As previously described, the active region 24 is formed where the top electrode 20 and the bottom electrode 22 overlap. In this manner, misalignment of the top electrode 20 with the bottom electrode 22 during fabrication may impair performance of the BAW resonator 38. By arranging the bottom electrode 22 with larger lateral dimensions than the top electrode 20, alignment tolerances for placement of the top electrode 20 may be increased, thereby improving manufacturing tolerances. In certain embodiments, the bottom electrode 22 may extend along a bottom of the piezoelectric layer 18 a distance that is in a range from 200 nm to 1 μm past a lateral edge of the top electrode 20 on a top of the piezoelectric layer 18.

Figure 9:
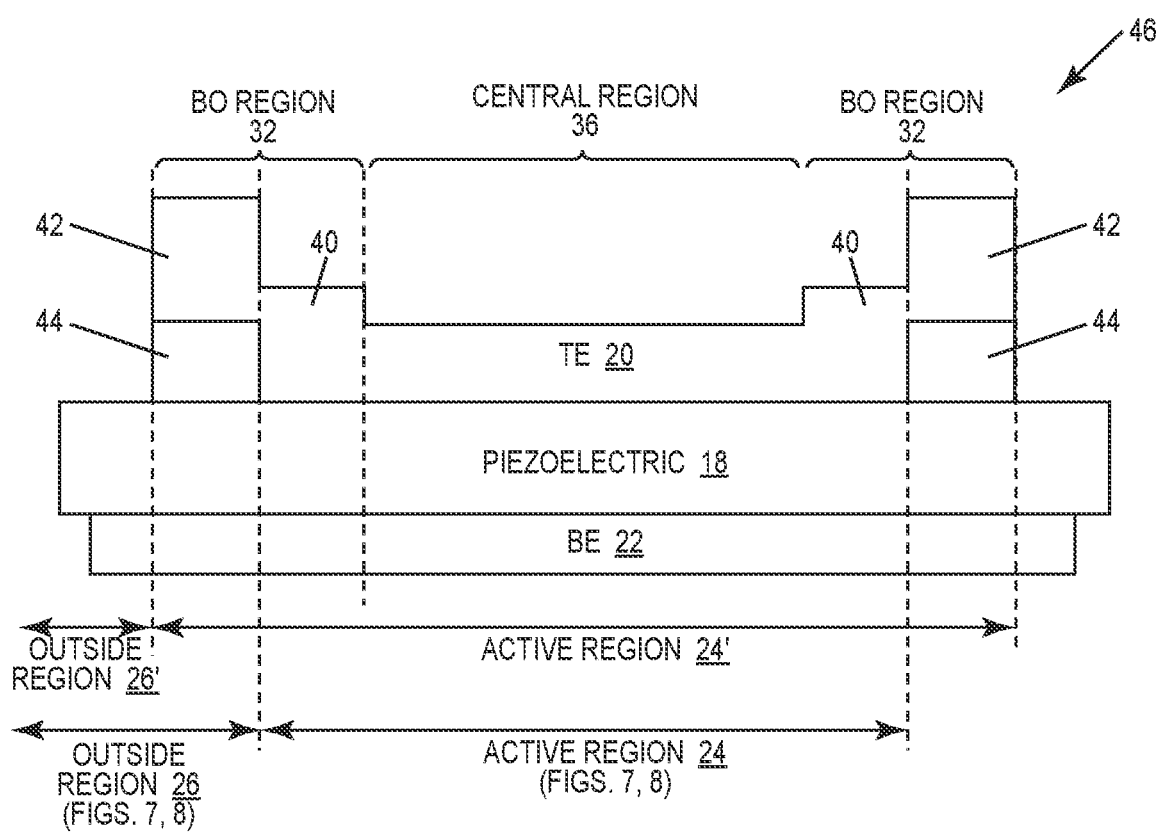
FIG. 9 is a cross-sectional diagram illustrating a BAW resonator that is arranged similar to the BAW resonator of FIG. 8, but with a larger area configuration of the central region of the top electrode according to embodiments disclosed herein.

FIG. 9 is a cross-sectional diagram illustrating a BAW resonator 46 that is arranged similar to the BAW resonator 38 of FIG. 8, but with a larger area configuration of the central region 36 of the top electrode 20 according to embodiments disclosed herein. For illustrative purposes, FIG. 9 is a simplified view of the BAW resonator 46 and is not necessarily drawn to scale; however, it is understood the BAW resonator 46 may include many of the same components as the BAW resonator 10 of FIG. 4. In FIG. 9, the BO region 32 is configured with the inner step 40, the outer step 42, and the spacer layer 44 as described for FIG. 8. The top electrode 20 of the BAW resonator 46 is configured to extend a larger distance across the piezoelectric layer 18. Accordingly, an area of the central region 36 that is laterally bounded by the BO region 32 is increased. Additionally, the area of overlap between the top electrode 20 and the bottom electrode 22 is increased, thereby providing a larger active region 24' and smaller outside region 26' for the BAW resonator 46 than the BAW resonator 38 of FIG. 8. For illustrative purposes the relative size of the active region 24 and the outside region 26 of FIGS. 7 and 8 is included in the illustration of FIG. 9.

Figure 10:
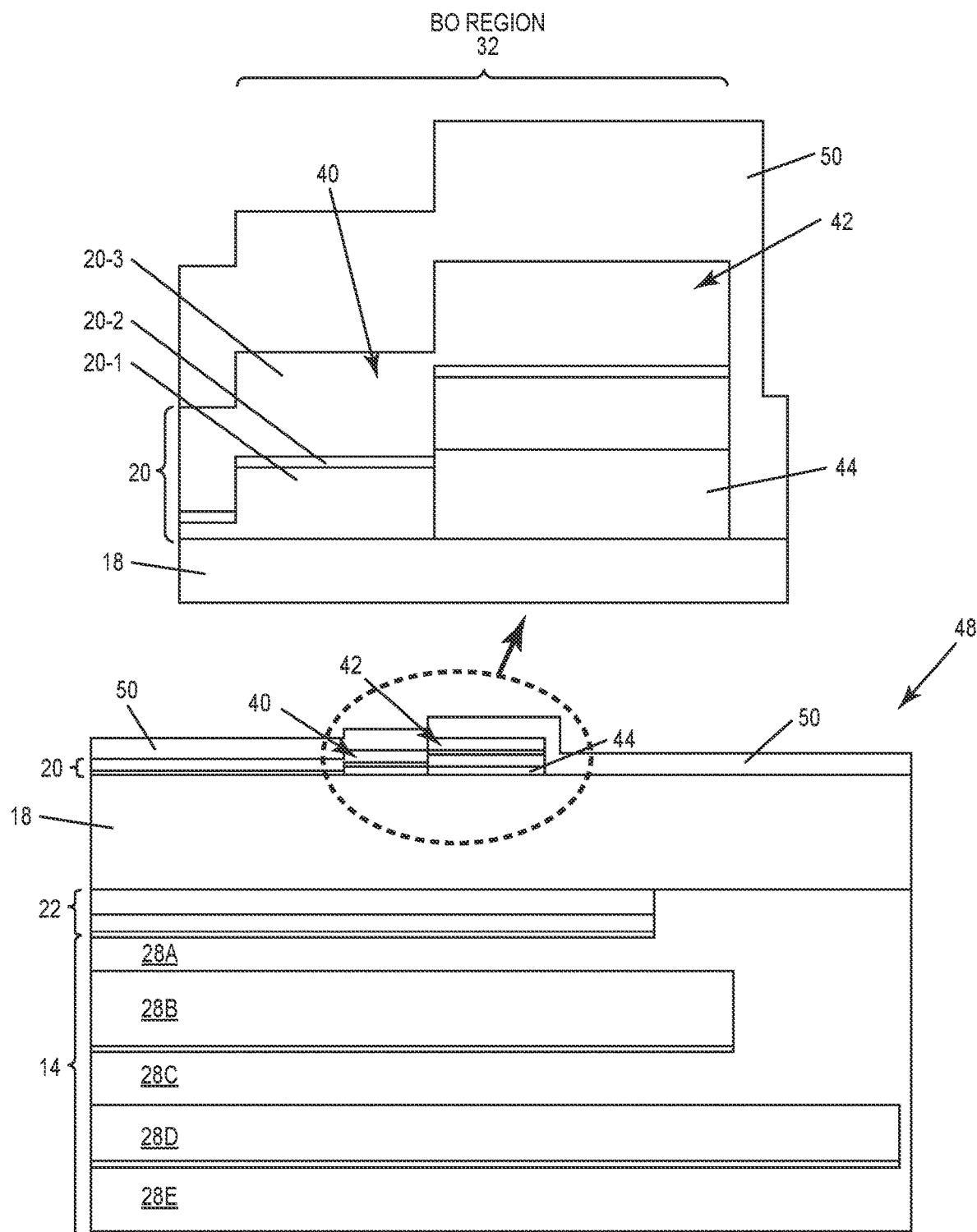
FIG. 10 is a cross-sectional diagram illustrating a portion of a BAW resonator that includes a passivation layer over the top electrode according to embodiments disclosed herein.

FIG. 10 is a cross-sectional diagram illustrating a portion of a BAW resonator 48 that includes a passivation layer 50 over the top electrode 20 according to embodiments disclosed herein. For illustrative purposes, a magnified view of a portion of the BAW resonator 48 that includes the BO region 32 is also provided. As illustrated, the BAW resonator 48 includes the reflector 14 that includes the stack of reflector layers 28A through 28E. In certain embodiments, the reflector layers 28A, 28C, 28E comprise $SiO_2$ while the reflector layers 28B, 28D comprise W. A thin layer of AlN may also be provided at one or more interfaces of $SiO_2$/W. In some configurations, portions of the reflector layers 28A, 28C, 28E may be continuous beyond peripheral edges of the bottom electrode 22. The passivation layer 50 may comprise silicon nitride (SiN, $Si_xN_y$, $Si_3N_4$) that is provided in a conformal arrangement over the top electrode 20 and the inner and outer steps 40, 42. In certain embodiments, the passivation layer 50 extends to a peripheral edge of the piezoelectric layer 18 such that the passivation layer 50 is provided in a conformal arrangement over the top electrode 20 and portions of the piezoelectric layer 18 that are uncovered by the top electrode 20 along a perimeter of the BAW resonator 48. In this manner, the passivation layer 50 extends the inner step 40, the outer step 42, and along sidewalls of the outer step 42. The top electrode 20 may comprise a single layer or a plurality of layers that collectively form the top electrode 20. In FIG. 10, the top electrode 20 includes a plurality of top electrode layers 20-1 to 20-3. In certain embodiments, the top electrode layer 20-1 comprises W, the top electrode layer 20-2 comprises a titanium tungsten alloy (TiW), and the top electrode layer 20-3 comprises an aluminum copper alloy (AlCu). As illustrated, a height or thickness of the top electrode layer 20-1 may increase for the inner step 40 and the outer step 42.

Figure 11:
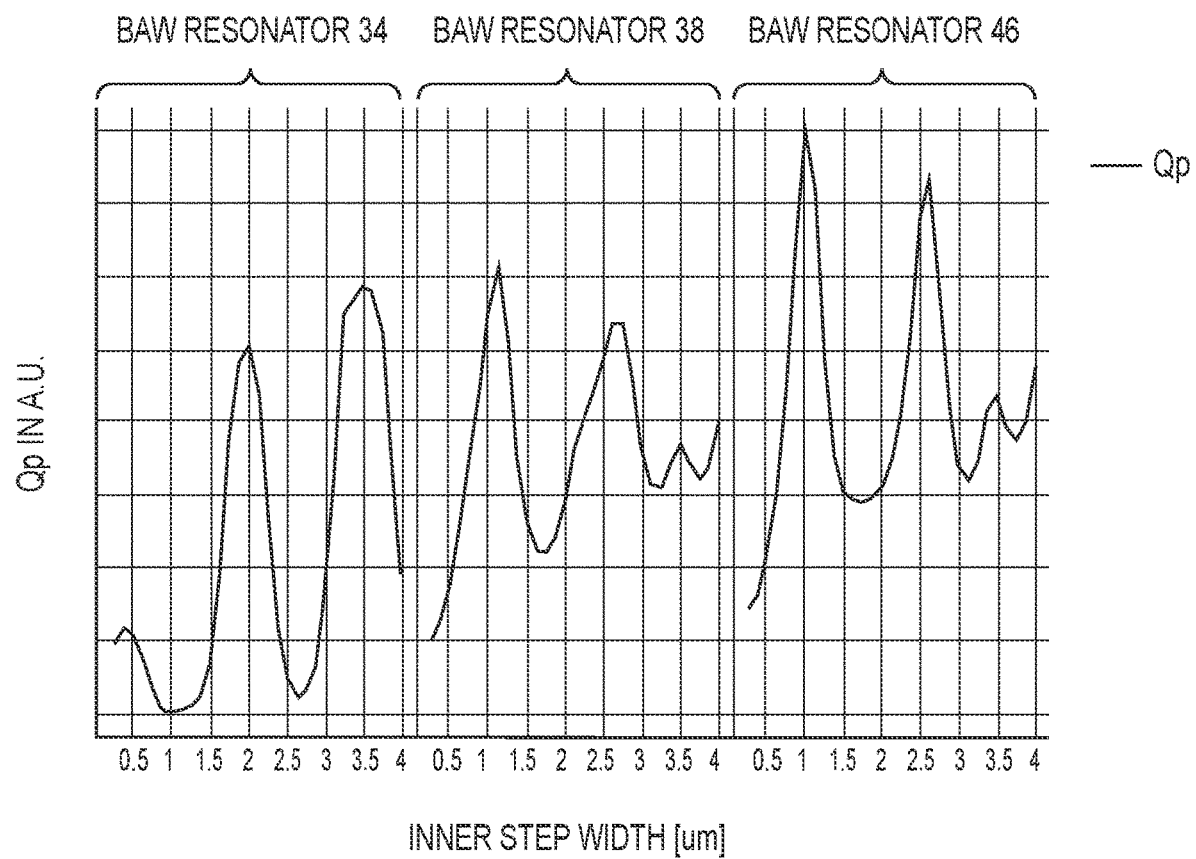
FIG. 11 is a diagram graphically illustrating simulation results showing the response of $Q_p$ values for various configurations of BAW resonators as illustrated in FIG. 10.
Figure 12:
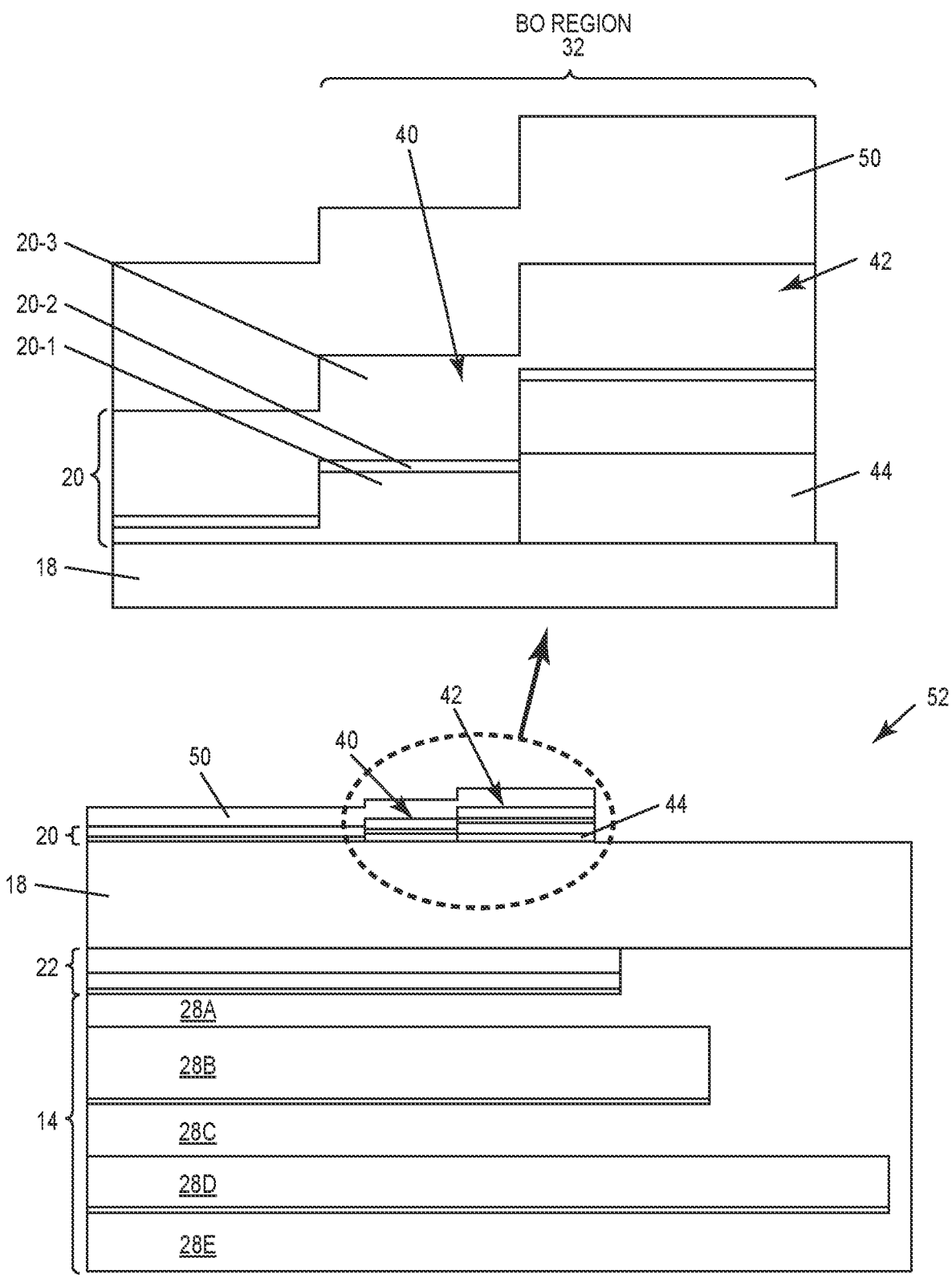
FIG. 12 is a cross-sectional diagram illustrating a portion of a BAW resonator where the passivation layer is inset from a peripheral edge of the piezoelectric layer according to embodiments disclosed herein.

FIG. 11 is a diagram graphically illustrating simulation results showing the response of $Q_p$ values for various configurations of BAW resonators as illustrated in FIG. 10. Simulation data was collected for three different BAW resonator structures, including the structure of the BAW resonator 34 of FIG. 7, the structure of the BAW resonator 38 of FIG. 8, and the structure of the BAW resonator 46 of FIG. 9. Each of the structures were configured as a transmitter (TX) resonator for operation at long term evolution (LTE) Band 7 with an arrangement as generally shown in FIG. 10. For the BAW resonators 38, 46 with dual-step configurations, a height or thickness of the top electrode layer 20-1 at the inner step 40 and the outer step 42 (e.g., above the spacer layer 44) was set at 80 nm, a height or thickness of the spacer layer 44 at the outer step 42 was set at 100 nm, and a width of the outer step 42 was set at 1.5 μm for the simulations. A width of the inner step 40 was varied from less than 0.5 μm to 4 μm as illustrated by the x-axis of FIG. 11. For comparison with the single step configuration of FIG. 7, the BAW resonator 34 included the same dimensions as described for the simulations of the BAW resonators 38, 46, but the spacer layer 44 was omitted from the BAW resonator 34. In this regard, the inner step width plotted in FIG. 11 for the BAW resonator 34 corresponds to the single raised step that was varied. As illustrated, the results for the BAW resonator 34 indicates a highest or optimum $Q_p$ value for the inner step width of about 3.5 μm and a second highest or optimum $Q_p$ value for the inner step width of about 2.0 μm. Notably, the dual-step configurations of the BAW resonators 38, 46 indicate highest or optimum $Q_p$ values for narrower inner step widths of about 1.0 μm that are also higher than any of the single step configurations of the BAW resonator 34. Additionally, the $Q_p$ values corresponding to leakage and scattering energy were also improved for an inner step width of about 1.0 μm. In this regard, the dual-step configurations of the BAW resonators 38, 46 with the spacer layers (44 of FIGS. 8 and 9) demonstrate improved $Q_p$ values resulting from less lateral energy leakage to the outside regions (26 of FIGS. 8 and 9) and less mode conversion at boundaries with the BO regions (32 of FIGS. 8 and 9). FIG. 12 is a cross-sectional diagram illustrating a portion of a BAW resonator 52 where the passivation layer 50 is inset from a peripheral edge of the piezoelectric layer 18 according to embodiments disclosed herein. The BAW resonator 52 includes the reflector 14 that includes the stack of reflector layers 28A through 28E, the bottom electrode 22, the piezoelectric layer 18, the top electrode 20 with the inner step 40 and the outer step 42, the spacer layer 44, and the passivation layer 50 as described above for FIG. 10. The top electrode 20 also include the top electrode layers 20-1 to 20-3. The passivation layer 50 is arranged in a conformal manner over the inner step 40 and the outer step 42 of the BO region 32; however, the passivation layer 50 does not extend to a peripheral edge of the piezoelectric layer 18 such that at least a portion of the piezoelectric layer 18 that is uncovered by the top electrode 20 is devoid of the passivation layer 50. In this manner, the passivation layer 50 is inset from peripheral edges of the piezoelectric layer 18 in a truncated arrangement on the piezoelectric layer 18. In certain embodiments, the passivation layer 50 may extend to a peripheral edge of the outer step 42 without extending past the outer step 42. In other embodiments, the passivation layer 50 may extend past the outer step 42 and on a portion of the piezoelectric layer 18 while still being inset from peripheral edges of the piezoelectric layer 18.

Figure 13:
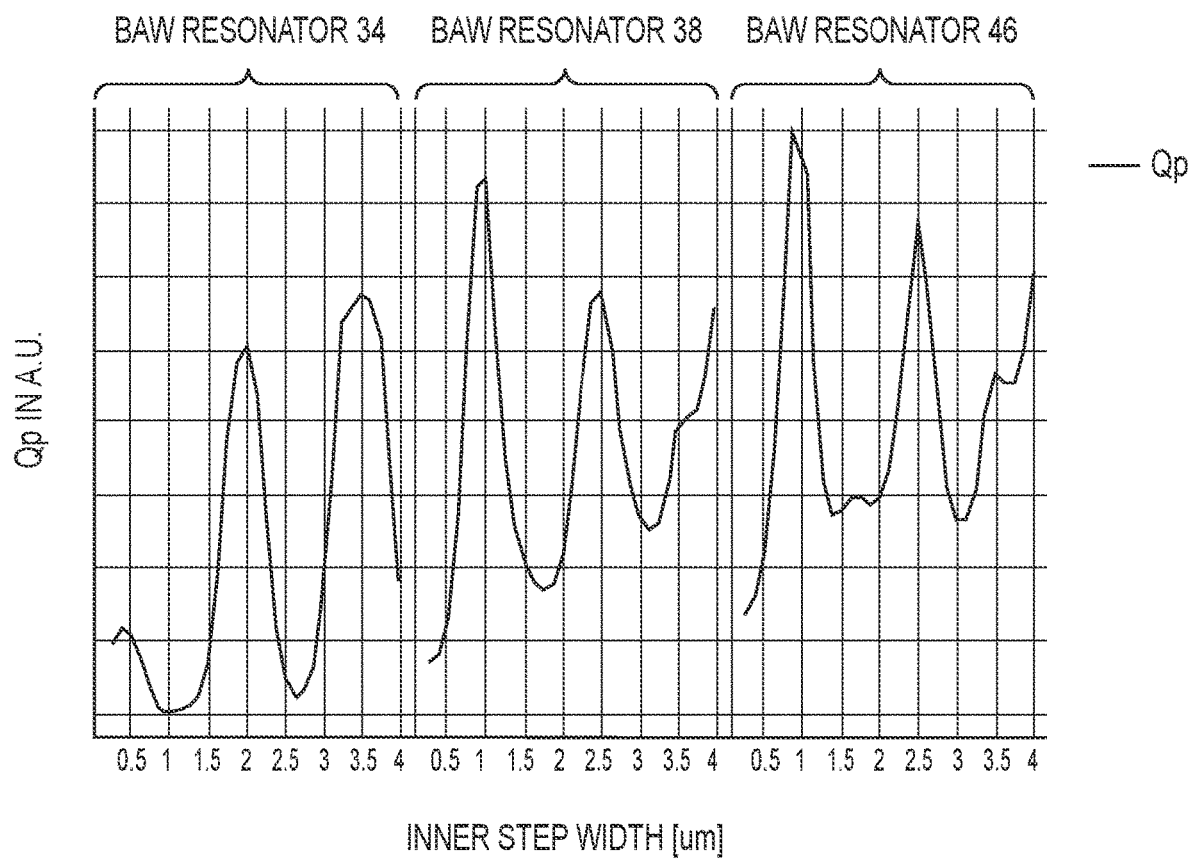
FIG. 13 is a diagram graphically illustrating simulation results showing the response of $Q_p$ values for various configurations of BAW resonators as illustrated in FIG. 12.

FIG. 13 is a diagram graphically illustrating simulation results showing the response of $Q_p$ values for various configurations of BAW resonators as illustrated in FIGS. 10 and 12. Simulation data was collected for three different BAW resonator structures, including the structure of the BAW resonator 34 of FIG. 7 with the arrangement of FIG. 10, the structure of the BAW resonator 38 of FIG. 8 with the arrangement of FIG. 12, and the structure of the BAW resonator 46 of FIG. 9 with the arrangement of FIG. 12. Each of the structures were configured as a TX resonator for operation at LTE Band 7 with an arrangement as generally shown in FIG. 12. For the BAW resonators 38, 46 with dual-step configurations, a height or thickness of the top electrode layer 20-1 at the inner step 40 and the outer step 42 (e.g., above the spacer layer 44) was set at 80 nm, a height or thickness of the spacer layer 44 at the outer step 42 was set at 100 nm, and a width of the outer step 42 was set at 1.5 μm for the simulations. A width of the inner step 40 was varied from less than 0.5 μm to 4 μm as illustrated by the x-axis of FIG. 13. For comparison with the single step configuration of FIG. 7, the BAW resonator 34 included the same dimensions as described for the simulations of the BAW resonators 38, 46, but the spacer layer 44 was omitted from the BAW resonator 34. In this regard, the inner step width plotted in FIG. 13 for the BAW resonator 34 corresponds to the single raised step that was varied. By arranging the passivation layer 50 to be inset from peripheral edges of the piezoelectric layer 18, the dual-step configurations of the BAW resonator 38 indicates notable improvements to its first optimum $Q_p$ value as compared with FIG. 11. Additionally, the dual-step configuration of the BAW resonator 46 maintains the strongest performance for the inner step width of about 1.0 μm by demonstrating a high overall $Q_p$ value as compared with FIG. 11. In this regard, the BAW resonator 38 demonstrates overall $Q_p$ values that are closer in magnitude to the BAW resonator 46.

Figure 14:
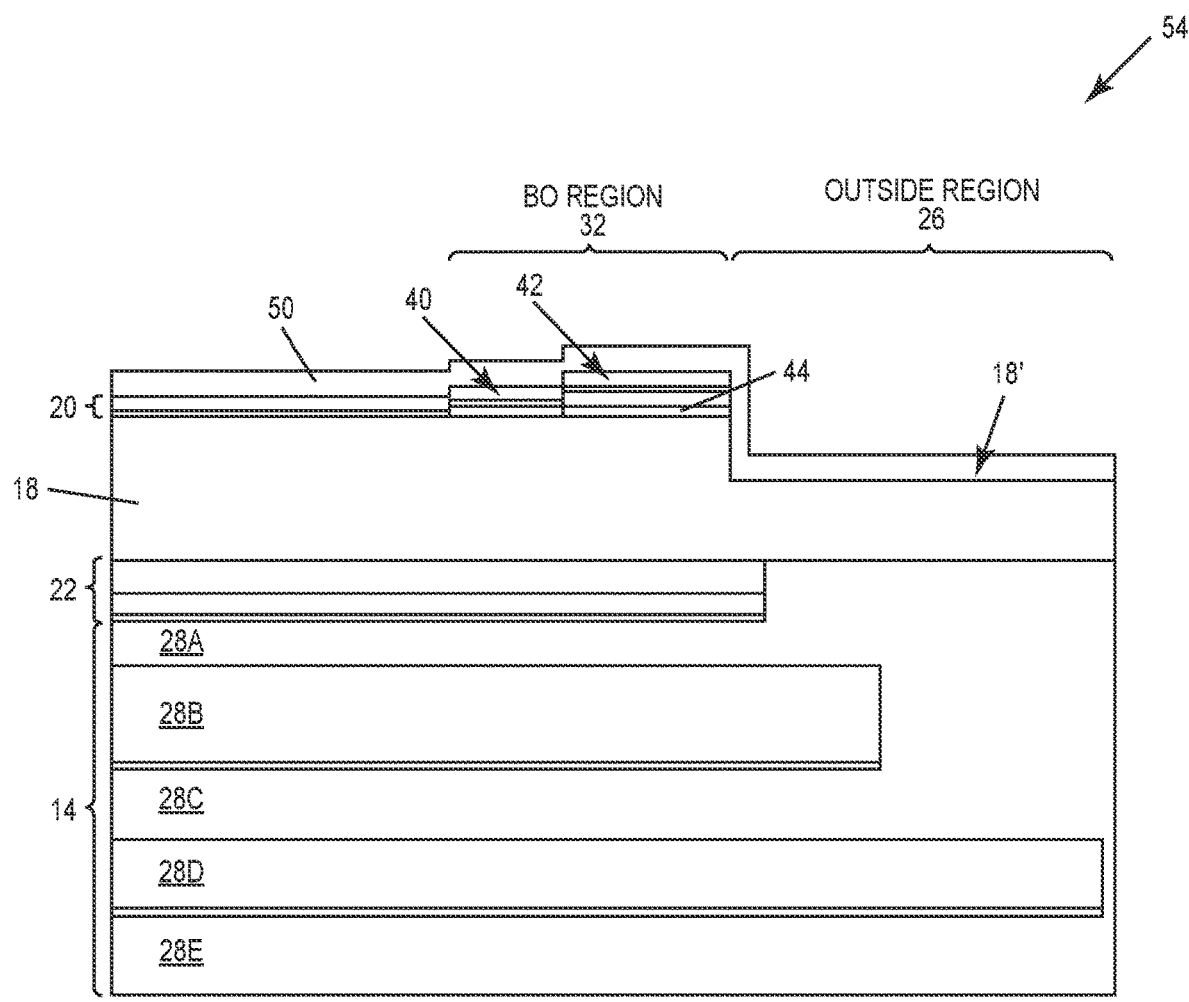
FIG. 14 is a cross-sectional diagram illustrating a portion of a BAW resonator where a portion of the piezoelectric layer in the outside region is arranged with a reduced height according to embodiments disclosed herein.

FIG. 14 is a cross-sectional diagram illustrating a portion of a BAW resonator 54 where a portion 18' of the piezoelectric layer 18 in the outside region 26 is arranged with a reduced thickness according to embodiments disclosed herein. The BAW resonator 54 includes the reflector 14 that includes the stack of reflector layers 28A through 28E, the bottom electrode 22, the piezoelectric layer 18, the top electrode 20 with the inner step 40 and the outer step 42, the spacer layer 44, and the passivation layer 50 as described above for FIG. 10. The BAW resonator also includes the BO region 32 with the inner step 40, the outer step 42, and the spacer layer 44 as previously described. As illustrated in FIG. 14, the piezoelectric layer 18 forms the reduced thickness portion 18' in or registered with the outside region 26 compared with portions of the piezoelectric layer 18 that are registered with the top electrode 20. In certain embodiments, a thickness of the piezoelectric layer 18 is reduced in a range from 200 nm to 500 nm to form the reduced thickness portion 18'. In certain embodiments, the passivation layer 50 extends to peripheral edges of the piezoelectric layer 18, including the reduced thickness portion 18'. By forming the reduced thickness portion 18' of the piezoelectric layer 18 in the outside region 26, lateral energy leakage to the outside region 26 and mode conversion at the BO region 32 may be reduced.

Figure 15:
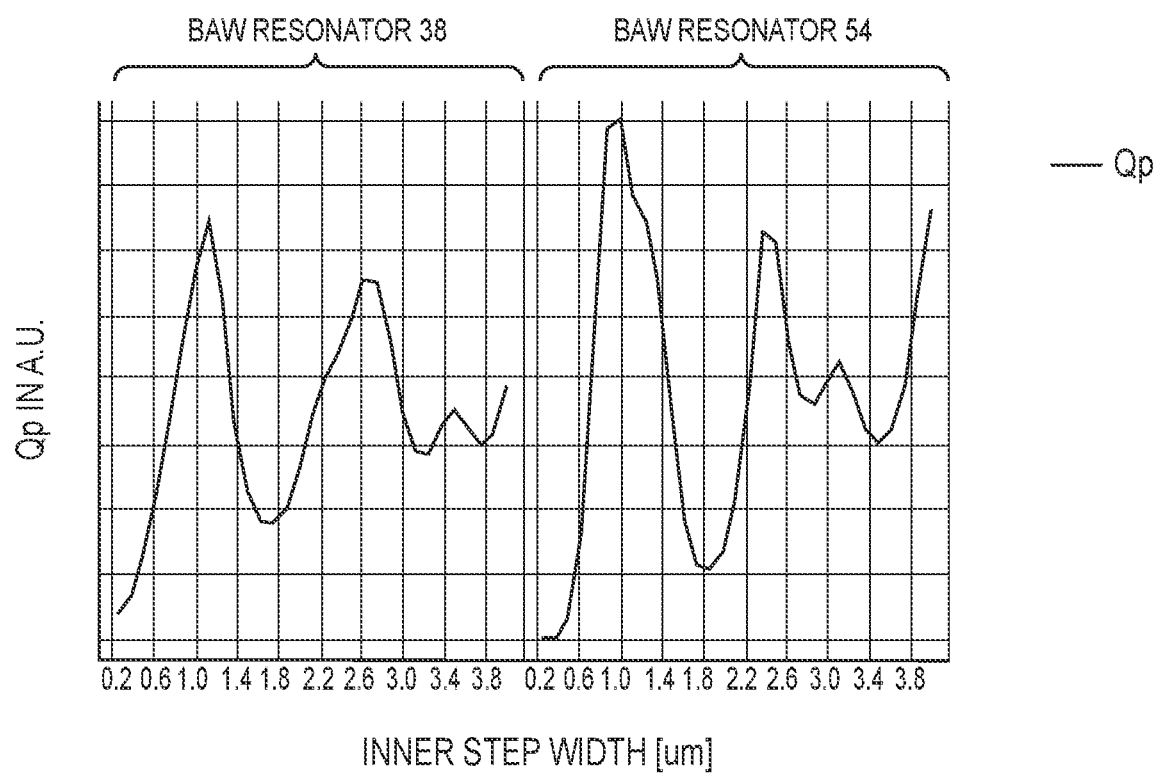
FIG. 15 is a diagram graphically illustrating simulation results showing the response of $Q_p$ values for configurations of the BAW resonator of FIG. 13 compared with the BAW resonator of FIG. 8.

FIG. 15 is a diagram graphically illustrating simulation results showing the response of $Q_p$ values for configurations of the BAW resonator 54 of FIG. 14 compared with the BAW resonator 38 of FIG. 8. In the simulations, overall $Q_p$ values were collected for structures configured as TX resonators for operation at LTE Band 7. With the exception of the reduced thickness portion 18' of the piezoelectric layer 18, dimensions and arrangements for the BAW resonator 54 were configured the same as the BAW resonator 38. For the simulations, the thickness of the piezoelectric layer 18 is reduced 400 nm in the reduced thickness portion 18' of the BAW resonator 54. As illustrated, the BAW resonator 54 indicates notable improvements to the overall $Q_p$ values, particularly for the inner step width of about 1 μm.

Figure 16A:
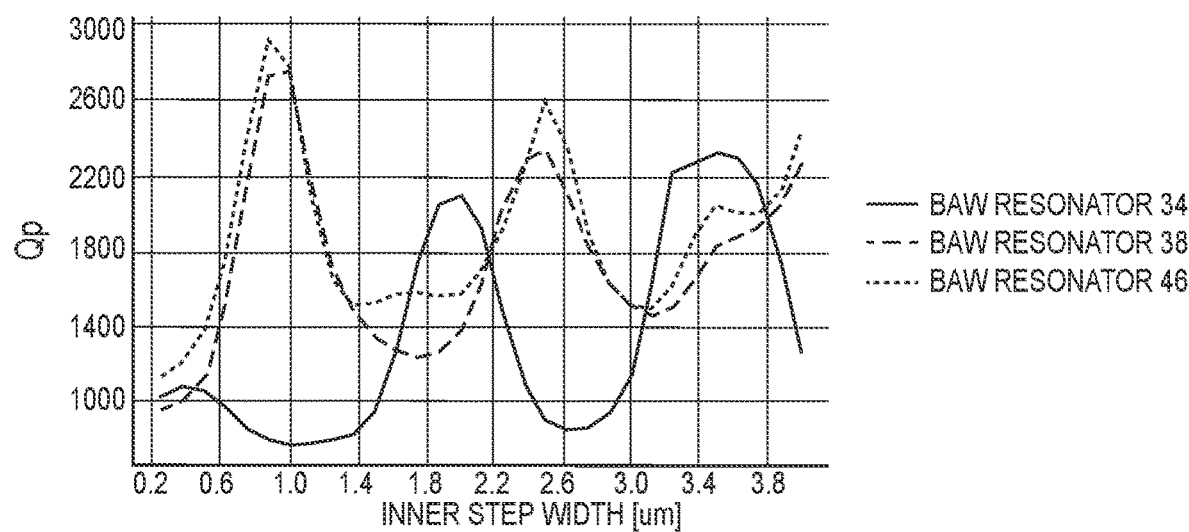
FIG. 16A is a diagram graphically illustrating a comparison of simulation results for $Q_p$ values of various configurations of the BAW resonators of FIG. 11.
Figure 16B:
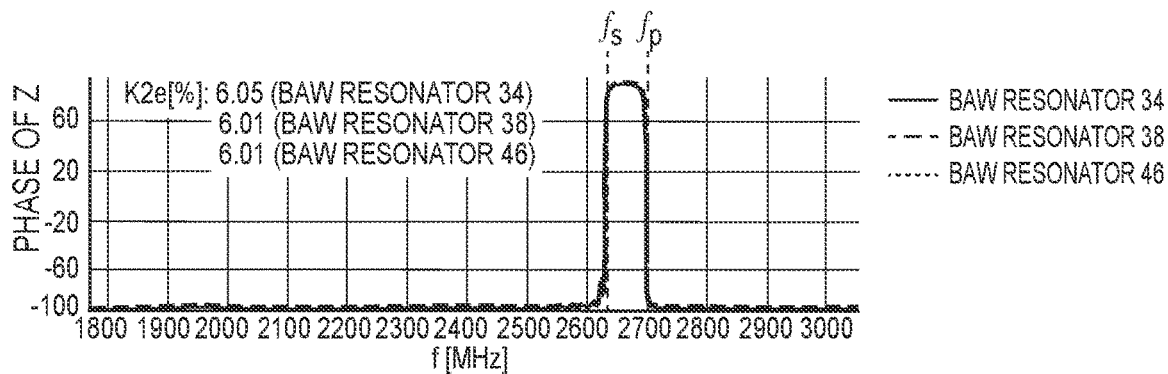
FIGS. 16B-16D are diagrams graphically comparing various performance characteristics for the same BAW resonators as the diagram of FIG. 16A.
Figure 16C:
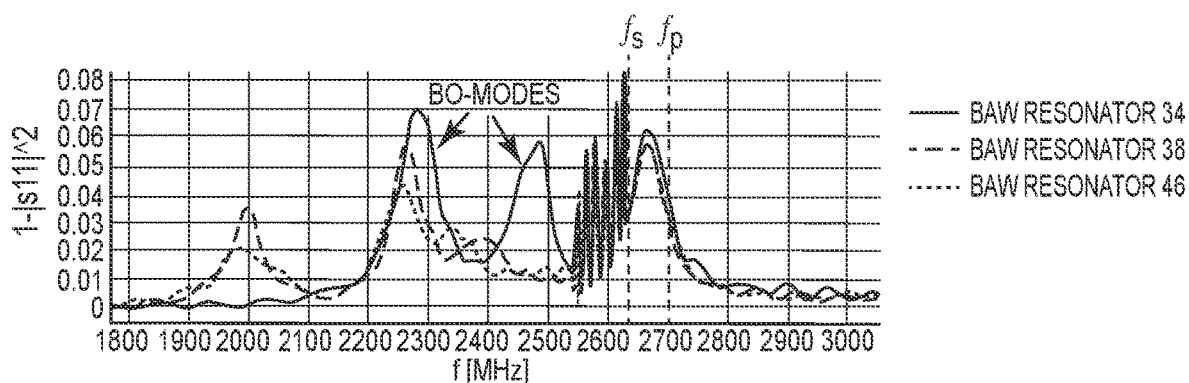
Figure 16D:
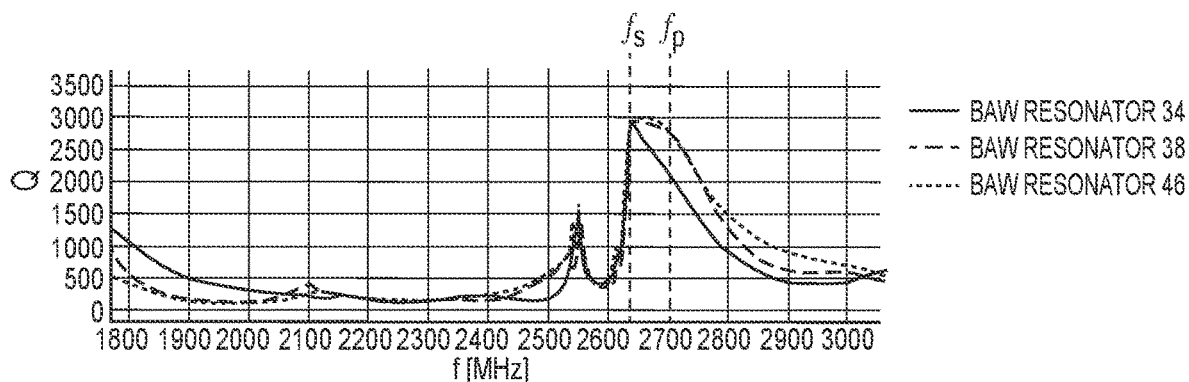

As disclosed herein, improvements to $Q_p$ values are demonstrated for various dual-step configurations of BAW resonator structures. The improvements are not just limited to $Q_p$ values as BAW resonator structures as disclosed herein may also demonstrate improved Q values for all operating frequencies above the main resonance frequency. FIG. 16A is a diagram graphically illustrating a comparison of simulation results for $Q_p$ values of configurations of the BAW resonators 34, 38, 46 of FIG. 13. As illustrated, an inner step width of 1 μm provides high $Q_p$ values for the BAW resonators 38, 46, and an inner (single) step width of 2 μm provides a high $Q_p$ value for the BAW resonator 34. FIGS. 16B-16D are diagrams graphically comparing various performance characteristics for the BAW resonator 34 with an inner step width of 2 μm with the BAW resonators 38, 46 with inner step widths of 1 μm of FIG. 16A. In FIG. 16B, the phase Z of the BAW resonators 34, 38, 46 is plotted by frequency in megahertz (MHz). Additionally, there is minimal difference in the effective electromechanical coupling factor (K2e in %) between the BAW resonators 34, 38, 46. In FIG. 16C, the y-axis represents the relationship of scattering parameter S11 of 1-(S11)². BO modes are shown with various peaks below the series resonance frequency ($f_s$). Notably, the BO modes for the BAW resonators 38, 46 are weaker and shifted farther away from the series resonance frequency ($f_s$). In particular, the highest magnitude BO modes for the BAW resonators 38, 46 are shifted in a range from 200 MHz to 300 MHz farther away from the series resonance frequency ($f_s$). Spurious modes that are visible just below the series resonance frequency ($f_s$) may be suppressed with apodization structures or by adding recessed or mass-reducing structures to the top electrode. FIG. 16D graphically compares the overall Q value for each of the BAW resonators 34, 38, 46. As illustrated, the Q value is consistently higher for the BAW resonators 38, 46 between the series resonance frequency ($f_s$) and the parallel resonance frequency ($f_p$), with notable improvement at $Q_p$.

Figure 17:
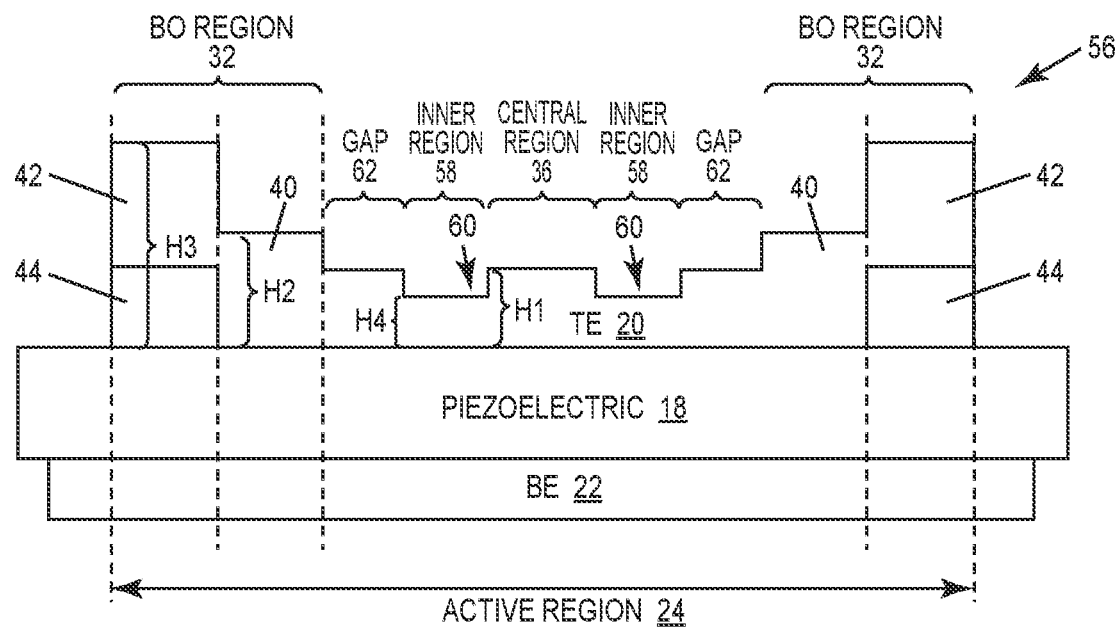
FIG. 17 is a cross-sectional diagram illustrating a BAW resonator where an inner region of the top electrode is arranged with a mass-reducing region according to embodiments disclosed herein.

FIG. 17 is a cross-sectional diagram illustrating a BAW resonator 56 where an inner region 58 of the top electrode 20 is arranged with a mass-reducing region according to embodiments disclosed herein. For illustrative purposes, FIG. 17 is a simplified view of the BAW resonator 56 and is not necessarily drawn to scale; however, it is understood the BAW resonator 56 may include many of the same components as the BAW resonator 10 of FIG. 4. The BAW resonator includes the bottom electrode 22, the piezoelectric layer 18, and the top electrode 20 as previously described. In particular, the BO region 32 includes the inner step 40 or first BO ring, the outer step 42 or second BO ring, and the spacer layer 44. The top electrode 20 additionally includes an inner ring 60 formed at the inner region 58 that peripherally bounds the central region 36. The inner ring 60 is a portion of the top electrode 20 where mass has been reduced. In this regard, the inner ring 60 forms a fourth height H4 from the piezoelectric layer 18 that is less than the first height H1 of the central region 36 and less than the third height H3 of the outer step 42 and the second height H2 of the inner step 40. In this manner, the outer step 42, the inner step 40, a gap 62, and the inner ring 60 may be arranged to form a descending step structure from the lateral edge of the top electrode 20 toward the central region 36. As depicted in FIG. 17, the inner ring 60 may be formed by a channel being recessed into the top electrode 20. Alternatively, the inner ring 60 may be formed at the same time as when the top electrode 20 is formed. In certain embodiments, the inner ring 60 (and inner region 58) may be spaced apart from the BO region 32 by the gap 62. In certain embodiments, the presence of the gap 62 may allow formation of a deeper inner ring 60, and thus, better manufacturing control of its depth. In other embodiments, the gap 62 may be omitted and as such the inner ring 60 is arranged directly adjacent to the inner step 40. By providing the inner ring 60 as a mass-reducing region, spurious modes below the series resonance frequency ($f_s$) may be suppressed with significantly improved performance. In certain embodiments, apodization may be used in combination with the inner ring 60.

Figure 18:
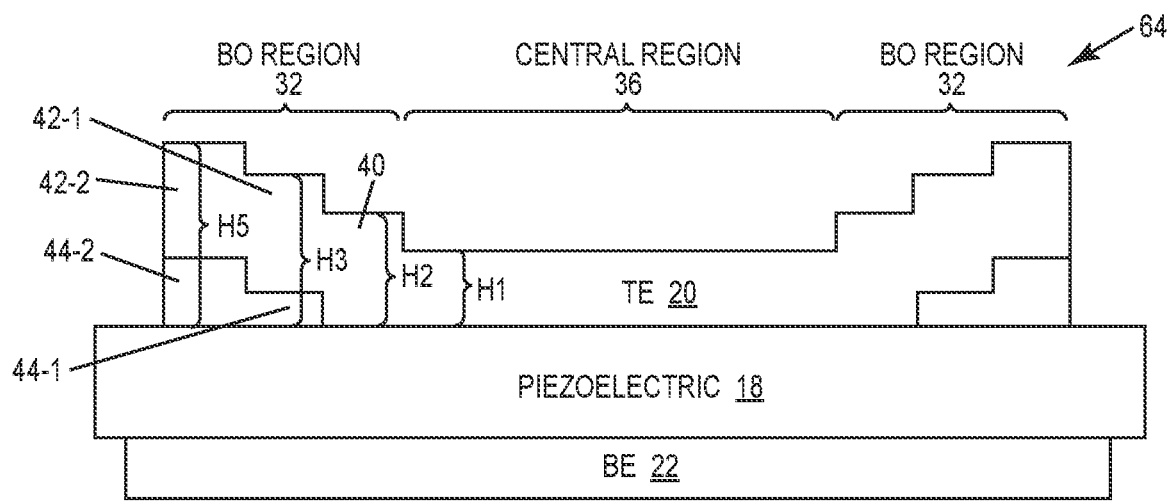
FIG. 18 is a cross-sectional diagram illustrating a BAW resonator where the top electrode includes multiple outer steps according to embodiments disclosed herein.

FIG. 18 is a cross-sectional diagram illustrating a BAW resonator 64 where the top electrode 20 includes multiple outer steps 42-1, 42-2 according to embodiments disclosed herein. For illustrative purposes, FIG. 18 is a simplified view of the BAW resonator 64 and is not necessarily drawn to scale; however, it is understood the BAW resonator 64 may include many of the same components as the BAW resonator 10 of FIG. 4. The BAW resonator 64 includes the bottom electrode 22, the piezoelectric layer 18, and the top electrode 20 as previously described. In certain embodiments, the BO region 32 includes the inner step 40 and a plurality of the outer steps 42-1, 42-2. A separate spacer layer 44-1, 44-2 (or spacer layer portion) is arranged between each of the outer steps 42-1, 42-2 and the piezoelectric layer 18 to provide a different height or thickness for each of the outer steps 42-1, 42-2 relative to the piezoelectric layer 18. In certain embodiments, the spacer layers 44-1, 44-2 are continuous with one another. As illustrated, the second outer step 42-2 forms a height H5 from the piezoelectric layer 18 that is greater than each of the third height H3 of the first outer step 42-1, the second height H2 of the inner step 40, and the first height H1 of the central region 36. In this manner, the outer steps 42-1, 42-2, the inner step 40, and the central region 36 may be arranged to form a step structure of descending heights from the lateral edge of the BO region 32 toward the central region 36.

Figure 19:
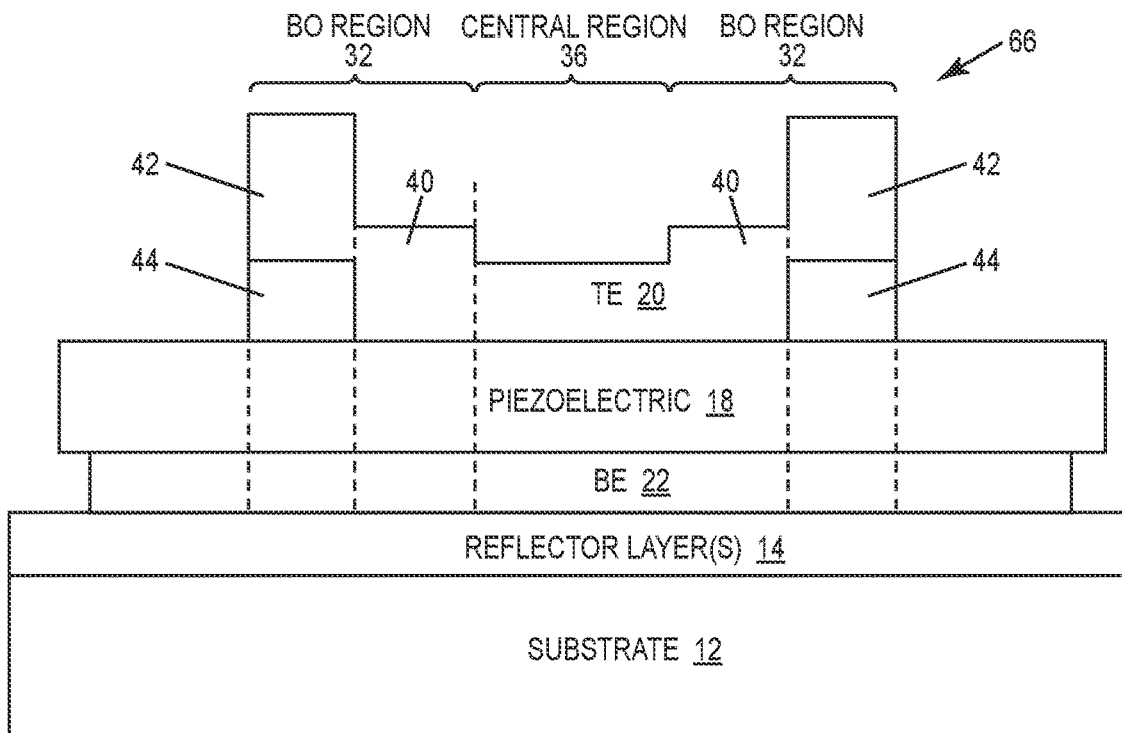
FIG. 19 is a cross-sectional diagram illustrating an exemplary solidly mounted resonator (SMR) type BAW resonator according to embodiments disclosed herein.
Figure 20:
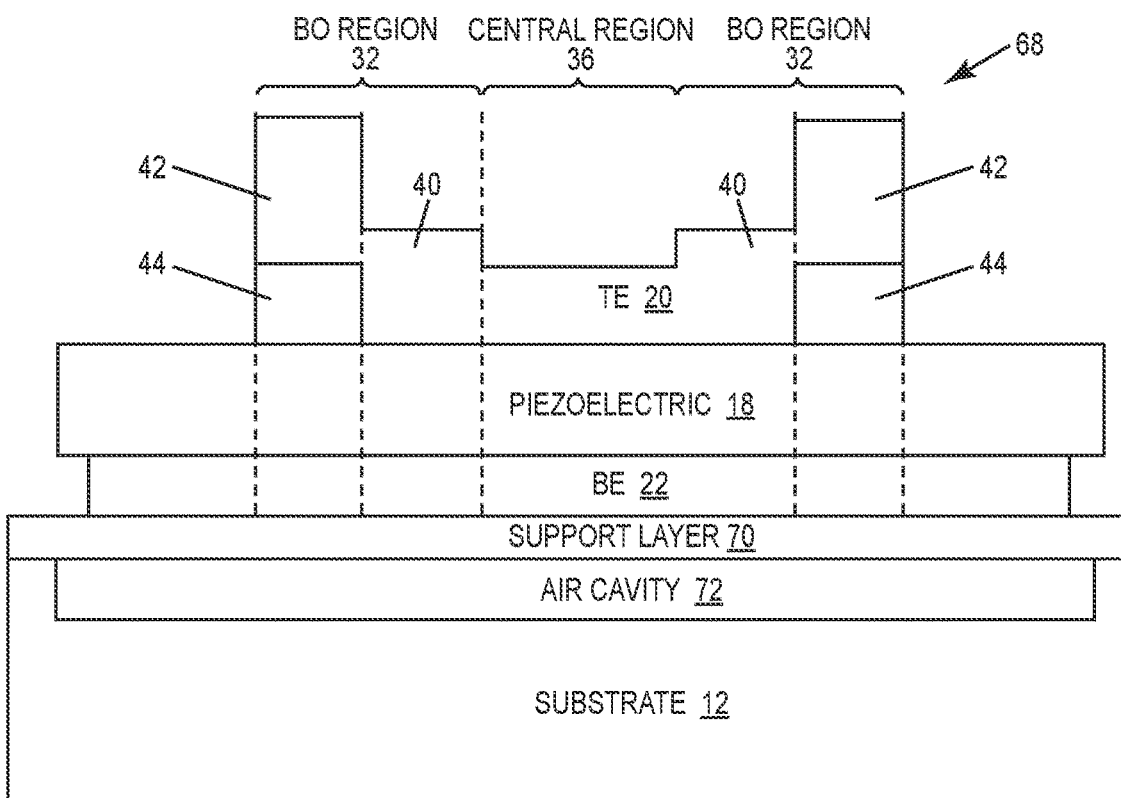
FIG. 20 is a cross-sectional diagram illustrating an exemplary film bulk acoustic resonator (FBAR) type BAW resonator according to embodiments disclosed herein.

Embodiments as described herein may be well suited for different arrangements of BAW resonators, including SMR and FBAR type BAW resonators. In particular, any of the various features and elements as disclosed above may provide improved performance for both SMR and FBAR type BAW structures. FIGS. 19 and 20 are provided to respectively illustrate exemplary SMR and FBAR structures.

FIG. 19 is a cross-sectional diagram illustrating an exemplary SMR type BAW resonator 66 according to embodiments disclosed herein. The BAW resonator 66 includes the bottom electrode 22, the piezoelectric layer 18, and the top electrode 20 as previously described. As illustrated, the BO region 32 may include the inner step 40, the outer step 42, and the spacer layer 44 as previously described, where the BO region 32 laterally bounds the central region 36. Additionally, the BAW resonator 66 may include one or more reflectors 14 and the substrate 12 as described for FIG. 4 to form the SMR structure. FIG. 20 is a cross-sectional diagram illustrating an exemplary FBAR type BAW resonator 68 according to embodiments disclosed herein. The BAW resonator 68 may include the bottom electrode 22, the piezoelectric layer 18, the top electrode 20, the inner step 40, the outer step 42, the spacer layer 44, and the central region 36 as previously described. Additionally, the BAW resonator 68 may include a support layer 70 over the substrate 12, with an air cavity 72 arranged therebetween.

Those skilled in the art will recognize improvements and modifications to the preferred embodiments of the present disclosure. All such improvements and modifications are considered within the scope of the concepts disclosed herein and the claims that follow.

What is claimed is:

1. A bulk acoustic wave (BAW) resonator comprising:
a bottom electrode;
a piezoelectric layer over the bottom electrode;
a top electrode over the piezoelectric layer, the top electrode defining a central region, an inner region that extends about a periphery of the central region, and a border (BO) region such that the inner region is between the central region and the BO region; and
a dielectric spacer layer arranged between the top electrode and the piezoelectric layer at the BO region, the dielectric spacer layer being in contact with the piezoelectric layer under the top electrode at the BO region;
wherein a height profile is defined across the central region, the inner region, and the BO region, and the height profile relative to the piezoelectric layer decreases from the BO region to the inner region and the height profile increases from the inner region to the central region.

2. The BAW resonator of claim 1, further comprising a passivation layer on the top electrode such that the height profile includes the top electrode and the passivation layer.

3. The BAW resonator of claim 2, wherein the dielectric spacer layer comprises silicon dioxide, silicon nitride, or aluminum nitride, and the passivation layer comprises silicon nitride.

4. The BAW resonator of claim 1, wherein the BO region comprises an outer BO region and an inner BO region, the inner BO region is between the outer BO region and the inner region, the height profile decreases from the outer BO region to the inner BO region, and the height profile further decreases from the inner BO region to the inner region.

5. The BAW resonator of claim 4, wherein the height profile comprises a first height at the central region, a second height at the inner BO region, a third height at the outer BO region, and a fourth height at the inner region, wherein the fourth height is smaller than each of the first height, the second height, and the third height.

6. The BAW resonator of claim 5, wherein the first height is smaller than each of the second height and the third height.

7. The BAW resonator of claim 5, wherein the inner BO region is an inner BO ring about the periphery of the central region, the outer BO region is an outer BO ring about a periphery of the inner BO ring, and the inner region is an inner ring between the inner BO ring and the central region.

8. The BAW resonator of claim 7, wherein the inner BO ring is a first mass loading region, the outer BO ring is a second mass loading region, and the inner ring is a mass-reducing region.

9. The BAW resonator of claim 1, further comprising a substrate and at least one layer below the bottom electrode such that the at least one layer is between the bottom electrode and the substrate.

10. The BAW resonator of claim 9, wherein the at least one layer comprises at least one layer of silicon dioxide.

11. The BAW resonator of claim 1, wherein the top electrode comprises a first layer of tungsten, a second layer of titanium tungsten alloy, and a third layer of aluminum copper.

12. A method of fabricating a bulk acoustic wave (BAW) resonator, the method comprising:
providing a bottom electrode below a piezoelectric layer;
selectively providing a dielectric spacer layer on one or more portions of the piezoelectric layer such that the piezoelectric layer is between the bottom electrode and the dielectric spacer layer; and
providing a top electrode over the dielectric spacer layer and the piezoelectric layer, the top electrode defining a central region, an inner region that extends about a periphery of the central region, and a border (BO) region such that the inner region is between the central region and the BO region, the dielectric spacer layer being in contact with the piezoelectric layer under the BO region;
wherein a height profile is defined across the central region, the inner region, and the BO region, and the height profile relative to the piezoelectric layer decreases from the BO region to the inner region and the height profile increases from the inner region to the central region.

13. The method of claim 12, further comprising providing a passivation layer on the top electrode in a conformal manner such that the height profile includes the top electrode and the passivation layer.

14. The method of claim 13, wherein the dielectric spacer layer comprises silicon dioxide, silicon nitride, or aluminum nitride, and the passivation layer comprises silicon nitride.

15. The method of claim 12, wherein:
the BO region comprises an outer BO region and an inner BO region such that the inner BO region is between the outer BO region and the inner region;
the height profile comprises a first height at the central region, a second height at the inner BO region, a third height at the outer BO region, and a fourth height at the inner region; and
the fourth height is smaller than each of the first height, the second height, and the third height.

16. The method of claim 15, wherein the inner BO region is an inner BO ring about the periphery of the central region, the outer BO region is an outer BO ring about a periphery of the inner BO ring, and the inner region is an inner ring between the inner BO ring and the central region.

17. A wireless device comprising,
one or more bulk acoustic wave (BAW) resonators, wherein at least one of the one or more BAW resonators comprises:
a bottom electrode;
a piezoelectric layer over the bottom electrode;
a top electrode over the piezoelectric layer, the top electrode defining a central region, an inner region that extends about a periphery of the central region, and a border (BO) region such that the inner region is between the central region and the BO region; and
a dielectric spacer layer arranged between the BO region and the piezoelectric layer, the dielectric spacer layer being in contact with the piezoelectric layer under the BO region;
wherein a height profile is defined across the central region, the inner region, and the BO region, and the height profile relative to the piezoelectric layer decreases from the BO region to the inner region and the height profile increases from the inner region to the central region.

18. The wireless device of claim 17, wherein the at least one of the one or more BAW resonators further comprises a passivation layer on the top electrode such that the height profile includes the top electrode and the passivation layer.

19. The wireless device of claim 17, wherein:
the BO region comprises an outer BO region and an inner BO region such that the inner BO region is between the outer BO region and the inner region;
the height profile comprises a first height at the central region, a second height at the inner BO region, a third height at the outer BO region, and a fourth height at the inner region; and
the fourth height is smaller than each of the first height, the second height, and the third height.

20. The wireless device of claim 19, wherein the inner BO region is an inner BO ring about the periphery of the central region, the outer BO region is an outer BO ring about a periphery of the inner BO ring, and the inner region is an inner ring between the inner BO ring and the central region.

* * * * *